(12) United States Patent
Soh

(10) Patent No.: US 8,664,983 B1
(45) Date of Patent: Mar. 4, 2014

(54) PRIORITY CONTROL PHASE SHIFTS FOR CLOCK SIGNALS

(75) Inventor: Lip Kai Soh, Sitiawan (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/427,298

(22) Filed: Mar. 22, 2012

(51) Int. Cl.
*H03L 7/00* (2006.01)

(52) U.S. Cl.
USPC ............ 327/141; 327/155; 327/160; 327/162

(58) Field of Classification Search
USPC ......... 327/149, 141, 144, 156, 159, 160, 161, 327/162, 163, 291, 292, 295, 296, 299; 375/376, 327

See application file for complete search history.

(56) References Cited

U.S. PATENT DOCUMENTS

| | | | |
|---|---|---|---|
| 6,594,331 B1 * | 7/2003 | Soda .............................. | 375/376 |
| 6,614,314 B2 * | 9/2003 | d'Haene et al. ............... | 331/1 A |
| 6,700,944 B1 * | 3/2004 | Chlipala et al. ............... | 375/376 |
| 7,027,544 B2 * | 4/2006 | Vaucher ......................... | 375/355 |
| 8,120,407 B1 | 2/2012 | Ooi et al. | |
| 2006/0056564 A1 | 3/2006 | Takeuchi | |
| 2009/0086868 A1 | 4/2009 | Shiraishi et al. | |
| 2009/0228227 A1 * | 9/2009 | Suda .............................. | 702/79 |
| 2010/0026350 A1 * | 2/2010 | Ozawa ........................... | 327/141 |
| 2012/0207259 A1 * | 8/2012 | Crain et al. .................... | 375/371 |

OTHER PUBLICATIONS

Ming-ta Hsieh and Gerald E. Sobelman, "Clock and Data Recovery with Adaptive Loop Gain for Spread Spectrum SerDes Applications," IEEE International Symposium on Circuits and Systems, 2005, pp. 4883-4886.
U.S. Appl. No. 13/053,797, filed Mar. 22, 2011, entitled "Techniques for Clock Data Recovery,".
U.S. Appl. No. 13/078,421, filed Apr. 1, 2011, "Circuits and Methods Using a Majority Vote,".

* cited by examiner

*Primary Examiner* — Lincoln Donovan
*Assistant Examiner* — Jung H Kim
(74) *Attorney, Agent, or Firm* — Steven J. Cahill

(57) ABSTRACT

A clock data recovery circuit includes a sampler circuit, a filter circuit, a control circuit, and a phase shift circuit. The sampler circuit samples input data in response to a clock signal. The filter circuit is coupled to the sampler circuit. The control circuit is coupled to the filter circuit. The phase shift circuit provides the clock signal to the sampler circuit. The control circuit causes the phase shift circuit to shift a phase of the clock signal by a first phase shift, and by a second phase shift after the phase of the clock signal has shifted by the first phase shift, in response to the filter circuit indicating to shift the phase of the clock signal by more than a predefined phase shift.

20 Claims, 20 Drawing Sheets

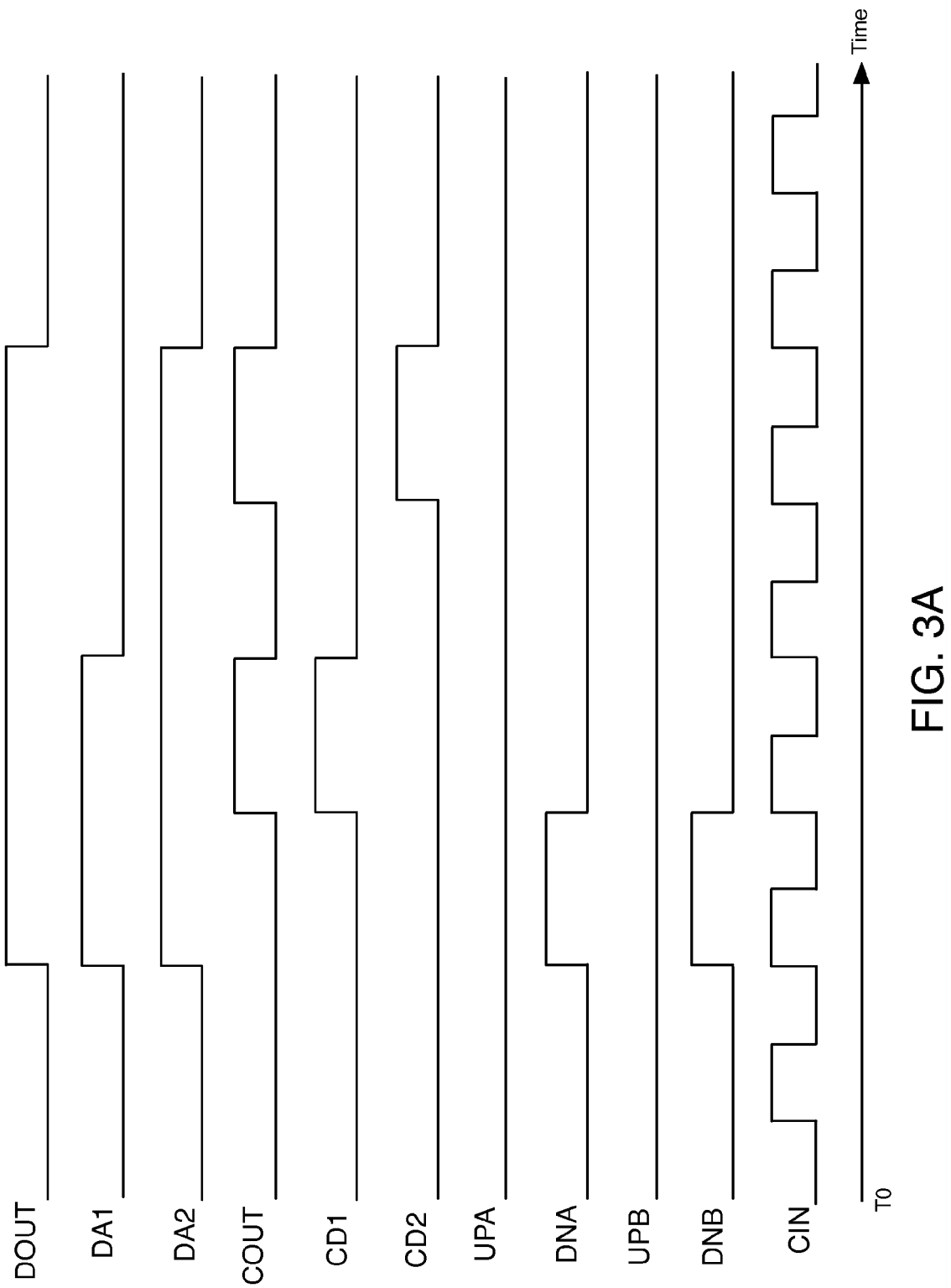

US 8,664,983 B1

PRIORITY CONTROL PHASE SHIFTS FOR CLOCK SIGNALS

TECHNICAL FIELD

The present invention relates to electronic circuits, and more particularly, to circuits and methods with priority control phase shifts for clock signals.

BACKGROUND

Synchronous digital systems are electronic systems that are driven by one or more clock signals. Because a clock signal is periodic, a clock signal has a narrow frequency spectrum. Synchronous digital systems generate electromagnetic energy on narrow frequency bands that include the frequency of the clock signal and its harmonics. The frequency spectrum of the clock signal and its harmonics may exceed desirable limits for electromagnetic interference at certain frequencies.

Some synchronous digital systems use spread-spectrum techniques to reduce electromagnetic interference. In a synchronous digital system that uses a spread-spectrum technique, the bandwidth of a signal is spread in the frequency domain to generate a signal having a wider bandwidth. Spread-spectrum techniques reduce the peak energy radiated by the system.

Some synchronous digital systems use spread-spectrum clocking (SSC). Serial AT-Attachment (SATA) is an example of an interface standard for electronic devices that requires spread-spectrum clocking (SSC). As an example, a data transmission system that transmits a data signal from a transmitter to a receiver according to the SATA 2.0 standard using a spread-spectrum technique and a modulation frequency of 30-33 kilohertz (kHz) has a triangular down-spreading profile that varies between 0 and 5000 parts per million (PPM) of a unit interval of the data signal. In this example, the data rate of the data signal transmitted by the transmission system varies between 3.0 gigabits per second (Gbps) and 2.97 Gbps over time in a triangular waveform.

BRIEF SUMMARY

According to some embodiments, a clock data recovery circuit includes a sampler circuit, a filter circuit, a control circuit, and a phase shift circuit. The sampler circuit samples input data in response to a clock signal. The filter circuit is coupled to the sampler circuit. The control circuit is coupled to the filter circuit. The phase shift circuit provides the clock signal to the sampler circuit. The control circuit causes the phase shift circuit to shift a phase of the clock signal by a first phase shift, and by a second phase shift after the phase of the clock signal has shifted by the first phase shift, in response to the filter circuit indicating to shift the phase of the clock signal by more than a predefined phase shift.

Various objects, features, and advantages of the present invention will become apparent upon consideration of the following detailed description and the accompanying drawings.

BRIEF DESCRIPTION OF THE DRAWINGS

FIGS. 3A-3B are timing diagrams that illustrate exemplary waveforms for signals shown in FIG. 2.

DETAILED DESCRIPTION

A clock data recovery circuit can generate recovered clock signals in response to an input data signal that is generated using a spread-spectrum technique. The clock data recovery circuit adjusts the phases of the recovered clock signals using spread-spectrum clocking (SSC) to track changes in the data rate of the input data signal. One type of clock data recovery circuit uses a phase interpolator circuit to generate the recovered clock signals. In response to changes in the data rate of the input data signal, the phase interpolator circuit generates at least a minimum phase shift in each of the recovered clock signals in one clock cycle. If the clock data recovery circuit generates phase shifts in the recovered clock signals that are twice the minimum phase shift in one clock cycle, the quantization error between the input data signal and the recovered clock signals increases, which increases the random jitter and phase noise in the recovered clock signals.

Figure 1:
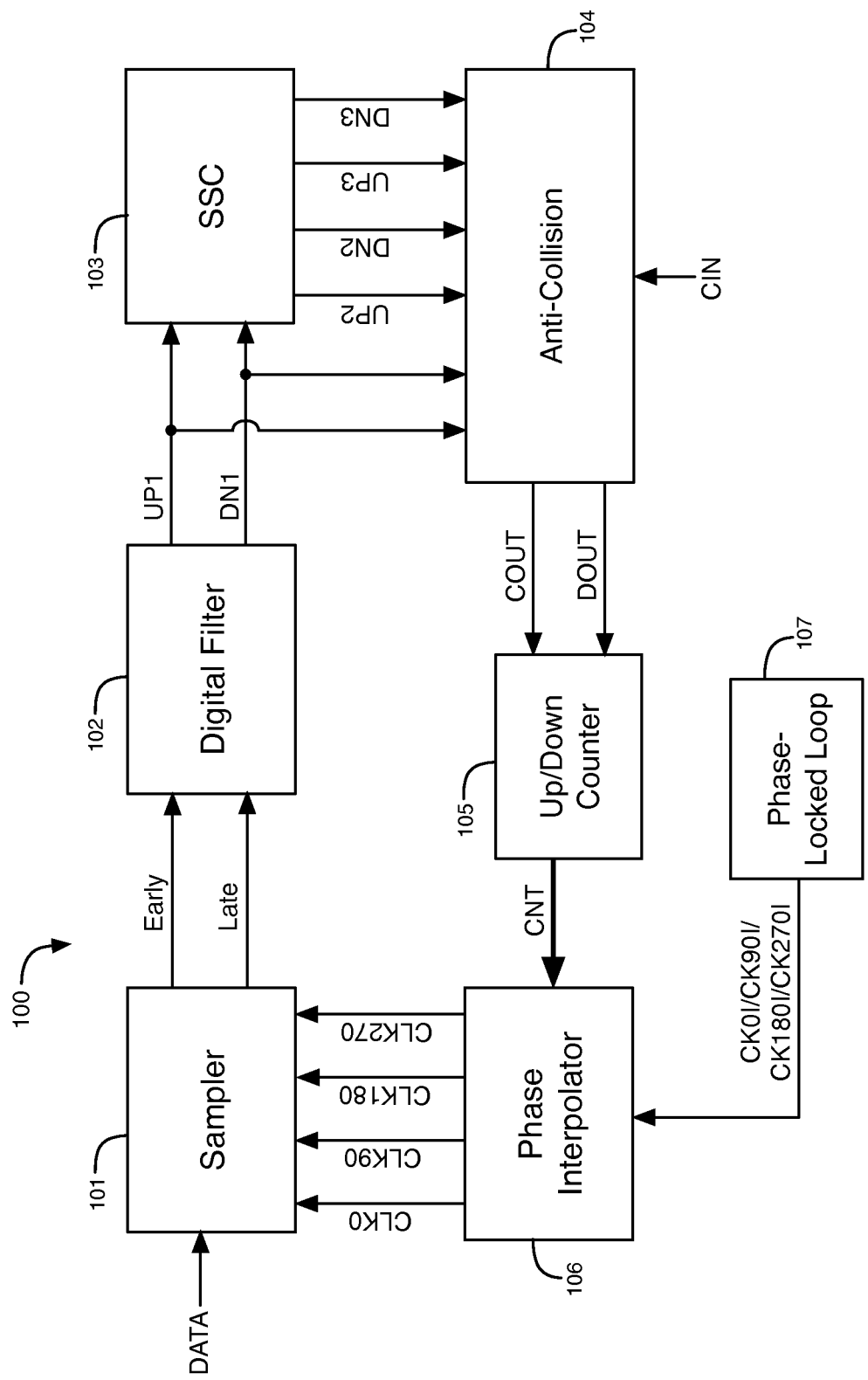
FIG. 1 illustrates an example of a clock data recovery (CDR) circuit.

According to some embodiments, a clock data recovery circuit generates recovered clock signals and adjusts the phases of the recovered clock signals by at most a minimum phase shift during each clock cycle using spread-spectrum clocking (SSC) to track changes in the data rate of an input data signal. FIG. 1 illustrates an example of a clock data recovery (CDR) circuit 100.

CDR circuit 100 is typically fabricated in an integrated circuit such as, for example, an application specific integrated circuit (ASIC), a field programmable gate array (FPGA), a programmable logic device (PLD), a memory integrated circuit, a processor or controller integrated circuit, an analog integrated circuit, etc. Clock data recovery circuit 100 includes sampler circuit 101, digital filter circuit 102, spread spectrum clocking (SSC) circuit 103, anti-collision circuit 104, up/down counter circuit 105, phase interpolator circuit 106, and phase-locked loop circuit 107. Circuits 101-106 are coupled in a feedback loop circuit.

A transmitter circuit in a first integrated circuit generates a data signal DATA according to a spread spectrum technique. The data signal DATA is provided to a receiver circuit in a second integrated circuit through one or more transmission lines. The receiver circuit includes CDR circuit 100. The data signal DATA is provided to an input of sampler circuit 101 as shown in FIG. 1. The data signal DATA may be single-ended or differential.

Phase interpolator (PI) circuit 106 generates multiple periodic clock signals including clock signals CLK0, CLK90, CLK180, and CLK270 in response to clock signals CK0I, CK90I, CK180I, and CK270I that are generated by phase-locked loop (PLL) circuit 107. Clock signals CK0I, CK90I, CK180I, and CK270I have relative phase offsets of 0°, 90°, 180°, and 270°, respectively. Clock signals CK0I, CK90I, CK180I, and CK270I have the same frequencies. Clock signals CLK0, CLK90, CLK180, and CLK270 are referred to herein as the recovered clock signals. The recovered clock signals CLK0, CLK90, CLK180, and CLK270 generated by PI circuit 106 have relative phase offsets of 0°, 90°, 180°, and 270°, respectively. CDR circuit 100 varies the phases of recovered clock signals CLK0, CLK90, CLK180, and CLK270 in response to variations in the data rate of the data signal DATA using spread-spectrum clocking in order to track the variations in the data rate of the data signal DATA.

Clock signals CLK0, CLK90, CLK180, and CLK270 are provided to inputs of sampler circuit 101. Sampler circuit 101 may include, for example, a bang-bang phase detector circuit. Sampler circuit 101 compares transitions in the data signal DATA to the phases of the 4 clock signals CLK0, CLK90, CLK180, and CLK270 to generate an Early signal and a Late signal. The Early and Late signals are indicative of the phase differences between the DATA signal and clock signals CLK0, CLK90, CLK180, and CLK270.

In a half-rate embodiment of CDR circuit 100, a unit interval (UI) in the data signal DATA is one-half of a period of each of the recovered clock signals. One unit interval equals one bit period in signal DATA. In a half-rate embodiment, sampler circuit 101 generates a logic high pulse in the Early signal in response to transitions in the data signal DATA occurring less than one-half a unit interval earlier in time than the rising edges in the CLK90 and CLK270 clock signals. Sampler circuit 101 generates a logic high pulse in the Late signal in response to transitions in the data signal DATA occurring less than one-half a unit interval later in time than the rising edges in the CLK90 and CLK270 clock signals.

The Early and Late signals are provided to inputs of digital filter circuit 102. Digital filter circuit 102 filters the Early and Late signals to generate two digital output signals UP1 and DN1. Digital filter circuit 102 filters components of the Early and Late signals that are caused by random jitter. Digital filter circuit 102 generates a logic high pulse in the UP1 signal and a logic low state in the DN1 signal when digital filter circuit 102 samples more logic high states in the Early signal than logic high states in the Late signal by a pre-determined number. Digital filter circuit 102 generates a logic high pulse in the DN1 signal and a logic low state in the UP1 signal when digital filter circuit 102 samples more logic high states in the Late signal than logic high states in the Early signal by a pre-determined number.

The UP1 and DN1 signals are provided to inputs of SSC circuit 103 and to inputs of anti-collision circuit 104. SSC circuit 103 is a second digital filter circuit. SSC circuit 103 generates signals UP2, UP3, DN2, and DN3 based on signals UP1 and DN1. SSC circuit 103 generates a logic high pulse in signal UP2 when the number of logic high pulses in the UP1 signal exceeds the number of logic high pulses in the DN1 signal by a first predefined number. SSC circuit 103 generates a logic high pulse in signal UP3 when the number of logic high pulses in the UP1 signal exceeds the number of logic high pulses in the DN1 signal by a second predefined number. The second predefined number is greater than the first predefined number. SSC circuit 103 generates a logic high pulse in the DN2 signal when the number of logic high pulses in the DN1 signal exceeds the number of logic high pulses in the UP1 signal by the first predefined number. SSC circuit 103 generates a logic high pulse in the DN3 signal when the number of logic high pulses in the DN1 signal exceeds the number of logic high pulses in the UP1 signal by the second predefined number.

In an embodiment, the UP1 or DN1 signal is asserted when the phases of the recovered clock signals need to be shifted by at least a minimum phase shift of phase interpolator (PI) circuit 106 based on the DATA signal. In this embodiment, the UP2 or DN2 signal is asserted when the phases of the recovered clock signals need to be shifted by at least twice the minimum phase shift of PI circuit 106 based on the DATA signal. The UP3 or DN3 signal is asserted when the phases of the recovered clock signals need to be shifted by at least three times the minimum phase shift of PI circuit 106 based on the DATA signal.

The UP2, UP3, DN2, and DN3 signals are provided to inputs of anti-collision circuit 104. Anti-collision circuit 104 generates output signals COUT and DOUT based on signals UP1, DN1, UP2, UP3, DN2, and DN3 and a periodic input clock signal CIN. In an embodiment, clock signal CIN is generated by dividing one of the recovered clock signals, such that the frequency of CIN equals the frequency of the recovered clock signals divided by a positive integer number. In response to a logic high pulse in one or more of signals DN1, DN2, and DN3, anti-collision circuit 104 generates one or more logic high pulses in the COUT signal while the DOUT signal is in a logic high state. In response to a logic high pulse in one or more of signals UP1, UP2, and UP3, anti-collision circuit 104 generates one or more logic high pulses in the COUT signal while the DOUT signal is in a logic low state. Various embodiments of anti-collision circuit 104 are described below.

Output signals COUT and DOUT are provided to inputs of up/down counter circuit 105. Up/down counter circuit 105 generates count signals CNT based on the output signals COUT and DOUT of anti-collision circuit 104. Up/down counter circuit 105 increases the value of count signals CNT by one in response to each rising edge of signal COUT that occurs when signal DOUT is in a logic high state. Up/down counter circuit 105 decreases the value of count signals CNT by one in response to each rising edge of signal COUT that occurs when signal DOUT is in a logic low state.

Count signals CNT are provided to inputs of phase interpolator (PI) circuit 106. Anti-collision circuit 104 and up/down counter circuit 105 are a control circuit for phase interpolator circuit 106. The count signals CNT are digital control signals that encode the phase setting for phase interpolator (PI) circuit 106. PI circuit 106 decodes the count signals to generate decoded count signals. PI circuit 106 sets the phases of the recovered clock signals CLK0, CLK90, CLK180, and CLK270 based on the decoded count signals. PI circuit 106 adjusts the phases of the recovered clock signals CLK0, CLK90, CLK180, and CLK270 based on changes in the value of the decoded count signals. In response to each increase of 1 in the value of the count signals CNT, PI circuit 106 increases the phase of each of the recovered clock signals by a minimum phase shift such that rising and falling edges of the recovered clock signals occur later in time. In response to each decrease of 1 in the value of the count signals CNT, PI circuit 106 decreases the phase of each of the recovered clock signals by a minimum phase shift such that rising and falling edges of the recovered clock signals occur earlier in time.

PI circuit 106 may include one or multiple component phase interpolator circuits that generate one or more of the recovered clock signals. For example, phase interpolator circuit 106 can include 1, 2, or 4 component phase interpolator circuits.

SSC circuit 103 causes CDR circuit 100 to adjust the phases of the recovered clock signals using spread-spectrum clocking (SSC) to track changes in the data rate of the DATA signal that are caused by a spread-spectrum technique. SSC circuit 103 causes the phases of the recovered clock signals to adjust more quickly to changes in the data rate of the DATA signal. Thus, SSC circuit 103 causes the phases of the recovered clock signals to be more accurate relative to the DATA signal.

CDR circuit 100 changes the phases of the recovered clock signals to match a change in the data rate of the DATA signal. The changes in the phases of the recovered clock signals may be measured in parts per million (PPM) of a unit interval of the DATA signal. For example, CDR circuit 100 may shift the phase of each of the recovered clock signals by a minimum phase shift of 500 PPM, which equals (500×UI)/1,000,000, where a UI equals the unit interval of the DATA signal. In some embodiments described herein, CDR circuit 100 can generate phase shifts in the recovered clock signals in a range between 0 PPM and 5000 PPM to track changes in the data rate of the DATA signal using spread-spectrum clocking according to the SATA standard.

Figure 2:
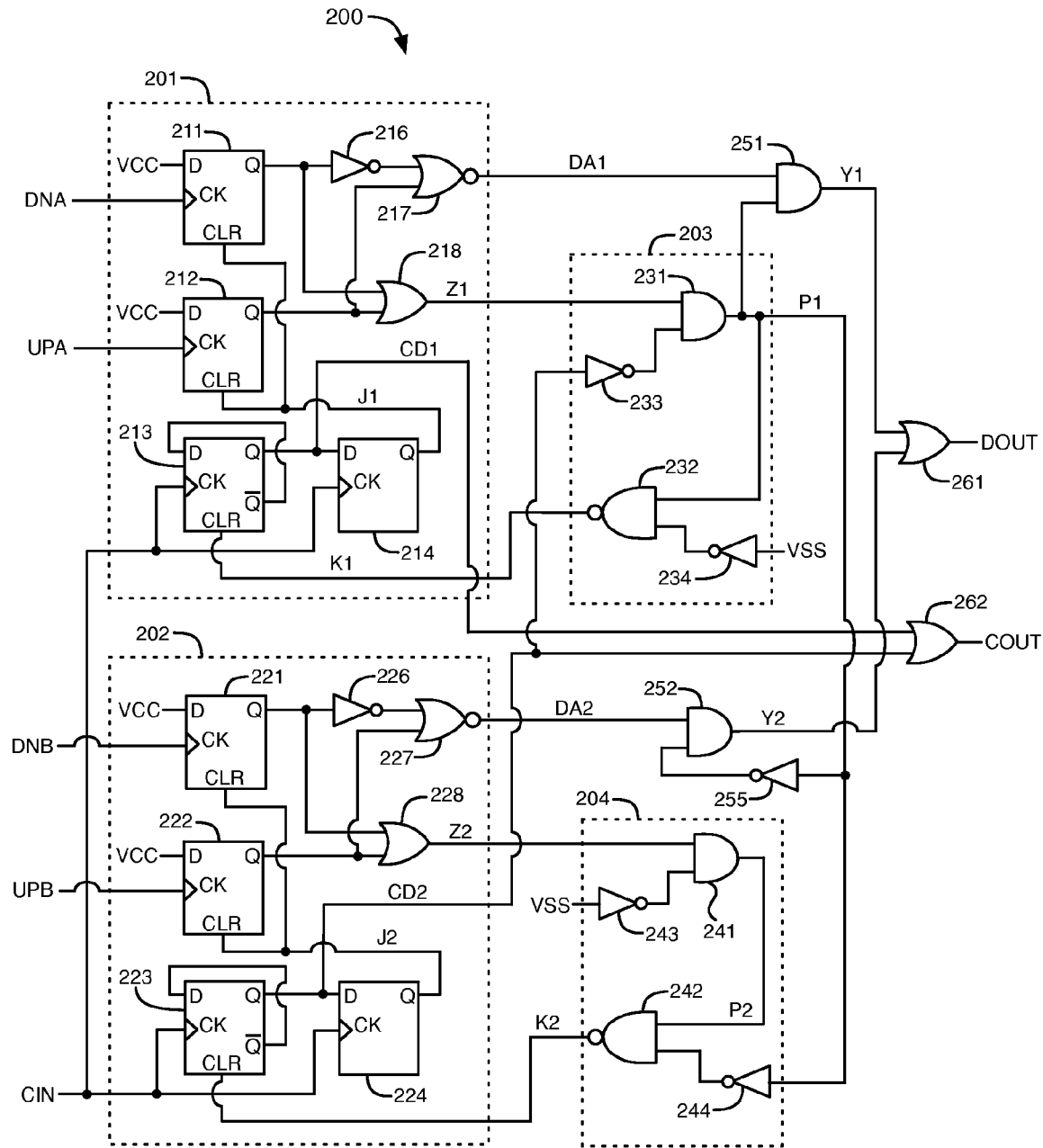
FIG. 2 illustrates an example of an anti-collision circuit.

FIG. 2 illustrates an example of an anti-collision circuit 200. Anti-collision circuit 200 includes storage circuits 201-202, priority control circuits 203-204, AND logic gate circuits 251-252, OR logic gate circuits 261-262, and inverter circuit 255. Storage circuit 201 includes D flip-flop circuits 211-214, inverter circuit 216, NOR logic gate circuit 217, and OR logic gate circuit 218. Storage circuit 202 includes flip-flop circuits 221-224, inverter circuit 226, NOR logic gate circuit 227, and OR logic gate circuit 228. Priority control circuit 203 includes AND logic gate circuit 231, NAND logic gate circuit 232, and inverter circuits 233-234. Priority control circuit 204 includes AND logic gate circuit 241, NAND logic gate circuit 242, and inverter circuits 243-244.

As shown in FIG. 2, an input signal DNA is provided to the clock (CK) input of flip-flop circuit 211, an input signal UPA is provided to the clock (CK) input of flip-flop circuit 212, an input signal DNB is provided to the clock (CK) input of flip-flop circuit 221, and an input signal UPB is provided to the clock (CK) input of flip-flop circuit 222. Periodic clock signal CIN is provided to the clock (CK) inputs of flip-flop circuits 213-214 and 223-224. A supply voltage VCC that represents a logic high state is provided to the D inputs of flip-flop circuits 211-212 and 221-222. A ground voltage VSS that represents a logic low state is provided to the inputs of inverter circuits 234 and 243.

According to some embodiments, anti-collision circuit 200 shown in FIG. 2 is in anti-collision circuit 104 in FIG. 1. In one example of anti-collision circuit 200 being used to implement anti-collision circuit 104, signal UPA is signal UP1, signal UPB is signal UP2, signal DNA is signal DN1, and signal DNB is signal DN2. In another example of anti-collision circuit 200 being used to implement anti-collision circuit 104, signal UPA is signal UP2, signal UPB is signal UP3, signal DNA is signal DN2, and signal DNB is signal DN3.

FIG. 3A is a timing diagram that illustrates exemplary waveforms for signals DOUT, DA1, DA2, COUT, CD1, CD2, UPA, DNA, UPB, DNB, and CIN shown in FIG. 2 when logic high pulses are generated in the DNA and DNB signals at the same time. In the example of FIG. 3A, signals DOUT, DA1, DA2, COUT, CD1, CD2, UPA, DNA, UPB, DNB, CIN, Z1-Z2, P1-P2, Y1-Y2, J142, and the signals at the Q outputs of flip-flop circuits 211-212 and 221-222 are all in logic low states at start time T0.

Inverter 234 generates an output signal in a logic high state at an input of NAND logic gate 232 in response to voltage VSS. Therefore, NAND logic gate 232 functions as an inverter that inverts the logic state of signal P1. Thus, when signal P1 is in a logic low state at time T0, NAND logic gate 232 generates a signal K1 in a logic high state at the clear (CLR) input of flip-flop circuit 213. When signals P1-P2 are in logic low states at time T0, NAND logic gate 242 generates a signal K2 in a logic high state at the clear (CLR) input of flip-flop circuit 223. While the signals at the CLR inputs of flip-flop circuits 213 and 223 are in logic high states, flip-flop circuits 213 and 223 maintain the CD1 and CD2 signals, respectively, at their Q outputs in logic low states and the signals at their inverting Q bar outputs in logic high states.

Inverter 243 generates an output signal in a logic high state at an input of AND logic gate 241 in response to voltage VSS. Therefore, AND logic gate 241 causes its output signal P2 to have the same logic state as its input signal Z2.

In response to a rising edge (i.e., a logic low-to-high transition) in signal DNA after time T0, flip-flop circuit 211 generates a rising edge in the signal stored at its Q output. In response to the rising edge in the signal at the Q output of flip-flop circuit 211, inverter 216 generates a falling edge (i.e., a logic high-to-low transition) in its output signal, NOR logic gate circuit 217 generates a rising edge in its output signal DA1 as shown in FIG. 3A, and OR logic gate circuit 218 generates a rising edge in its output signal Z1.

When OR logic gate circuit 218 generates the rising edge in signal Z1, signal CD2 is in a logic low state, because the output signal K2 of NAND logic gate 242 at the clear (CLR) input of flip-flop circuit 223 is in a logic high state. In response to signal CD2 being in a logic low state, inverter circuit 233 generates a logic high state in its output signal. In response to the rising edge in signal Z1 and the logic high output signal of inverter circuit 233, AND logic gate 231 generates a rising edge in its output signal P1. In response to the rising edges in its input signals DA1 and P1, AND logic gate 251 generates a rising edge in its output signal Y1. OR gate 261 then generates a rising edge in its output signal DOUT in response to the rising edge in its input signal Y1, as shown in FIG. 3A.

In response to a rising edge in signal DNB after time T0, flip-flop circuit 221 generates a rising edge in the signal stored at its Q output. In response to the rising edge in the signal at the Q output of flip-flop circuit 221, inverter 226 generates a falling edge in its output signal, NOR logic gate circuit 227 generates a rising edge in its output signal DA2 as shown in FIG. 3A, and OR logic gate circuit 228 generates a rising edge in its output signal Z2. The output signal of AND logic gate 252 remains in a logic low state, because the output signal of inverter circuit 255 is in a logic low state in response to the logic high state in signal P1.

In response to the rising edge in signal Z2 and the logic high output signal of inverter circuit 243, AND logic gate 241 generates a rising edge in its output signal P2. The output signal K2 of NAND logic gate 242 remains in a logic high state, because the output signal of inverter circuit 244 is in a logic low state in response to the logic high state in signal P1. Flip-flop circuit 223 maintains signal CD2 in a logic low state while signal K2 at its CLR input is in a logic high state.

After the rising edge occurs in signal P1 in response to the rising in signal DNA, NAND logic gate circuit 232 generates a falling edge in the signal K1 at the CLR input of flip-flop circuit 213. On the first rising edge in clock signal CIN that occurs after the falling edge in signal K1, flip-flop circuit 213 generates a rising edge in the signal CD1 stored at its Q output, as shown in FIG. 3A, and a falling edge in the signal at its inverting Q bar output. OR gate 262 generates a rising edge in its output signal COUT in response to the rising edge in its input signal CD1, as shown in FIG. 3A. On the second rising edge in clock signal CIN that occurs after the falling edge in signal K1, flip-flop circuit 213 generates a falling edge in signal CD1 as shown in FIG. 3A and a rising edge in the signal at its inverting Q bar output, and flip-flop circuit 214 generates a rising edge in the signal J1 stored at its Q output. OR gate 262 generates a falling edge in its output signal COUT in response to the falling edge in signal CD1, as shown in FIG. 3A.

The signal J1 at the Q output of flip-flop circuit 214 is provided to the clear (CLR) inputs of flip-flop circuits 211-212. In response to the rising edge in signal J1, flip-flop circuit 211 generates a falling edge in the signal stored at its Q output. The signal at the Q output of flip-flop circuit 212 remains in a logic low state. In response to the falling edge in the signal at the Q output of flip-flop circuit 211, NOR logic gate 217 and OR logic gate 218 generate falling edges in their output signals DA1 and Z1, respectively.

In response to the falling edge in signal Z1, AND logic gate 231 generates a falling edge in signal P1, and NAND logic gate 232 generates a rising edge in the signal K1 at the CLR input of flip-flop circuit 213. In response to the falling edge in signal DA1, AND logic gate 251 generates a falling edge in its output signal Y1. In response to the falling edge in signal P1, inverter 255 generates a rising edge in its output signal, causing AND logic gate 252 to generate a rising edge in its output signal Y2. In response to the rising edge in signal Y2, OR logic gate 261 maintains its output signal DOUT in a logic high state, as shown in FIG. 3A.

In response to the falling edge in signal P1, inverter 244 generates a rising edge in its output signal. With both of signal P2 and the output signal of inverter 244 in logic high states, NAND logic gate 242 generates a logic low state in the signal K2 at the CLR input of flip-flop circuit 223. On the first rising edge in clock signal CIN that occurs after the falling edge in signal K2, flip-flop circuit 223 generates a rising edge in the signal CD2 stored at its Q output, as shown in FIG. 3A, and a falling edge in the signal stored at its inverting Q bar output. OR gate 262 generates a second rising edge in its output signal COUT in response to the rising edge in its input signal CD2, as shown in FIG. 3A. On the second rising edge in clock signal CIN that occurs after the falling edge in signal K2, flip-flop circuit 223 generates a falling edge in signal CD2 as shown in FIG. 3A and a rising edge in the signal at its inverting Q bar output, and flip-flop circuit 224 generates a rising edge in the signal J2 stored at its Q output. OR gate 262 generates a second falling edge in its output signal COUT in response to the falling edge in signal CD2, as shown in FIG. 3A.

The signal J2 at the Q output of flip-flop circuit 224 is provided to the clear (CLR) inputs of flip-flop circuits 221-222. In response to the rising edge in signal J2, flip-flop circuit 221 generates a falling edge in the signal stored at its Q output. The signal at the Q output of flip-flop circuit 222 remains in a logic low state. In response to the falling edge in the signal at the Q output of flip-flop circuit 221, NOR logic gate 227 and OR logic gate 228 generate falling edges in their output signals DA2 and Z2, respectively. In response to the falling edge in signal DA2, AND logic gate 252 generates a falling edge in its output signal Y2. OR gate 261 then generates a falling edge in signal DOUT in response to the falling edge in signal Y2 and the logic low state in signal Y1, as shown in FIG. 3A. In response to the falling edge in signal Z2, AND logic gate 241 generates a falling edge in signal P2, and NAND logic gate 242 generates a rising edge in signal K2, causing signal CD2 to remain in a logic low state after subsequent rising edges in clock signal CIN.

As shown in FIG. 3A, anti-collision circuit 200 generates two logic high pulses in output signal COUT and one logic high pulse in output signal DOUT in response to concurrent logic high pulses in signals DNA and DNB. Each of the two logic high pulses in signal COUT lasts for one period of clock signal CIN, and the logic high pulse in signal DOUT lasts for four periods of clock signal CIN. Signal DOUT is in a logic high state for the duration of both of the logic high pulses in signal COUT.

Counter circuit 105 increases the value of the count signals CNT by two in response to the two rising edges in signal COUT shown in FIG. 3A that occur while signal DOUT is in a logic high state. Each rising edge in signal COUT occurs in a different period of clock signal CIN. PI circuit 106 increases the phase of each of the recovered clock signals to occur later in time by the minimum phase shift in response to each increase of one in the value of signals CNT.

PI circuit 106 shifts the phases of the recovered clock signals by the minimum phase shift in response to the first increase of 1 in the CNT signals. Subsequently, PI circuit 106 shifts the phases of the recovered clock signals by the minimum phase shift in response to the second increase of 1 in the CNT signals. CDR circuit 100 generates a total phase shift in each of the recovered clock signals equal to twice the minimum phase shift of PI circuit 106 in response to concurrent logic high pulses in signals DNA and DNB. The total phase shift is spread out over multiple periods of clock signal CIN to reduce the quantization error.

Figure 3B:
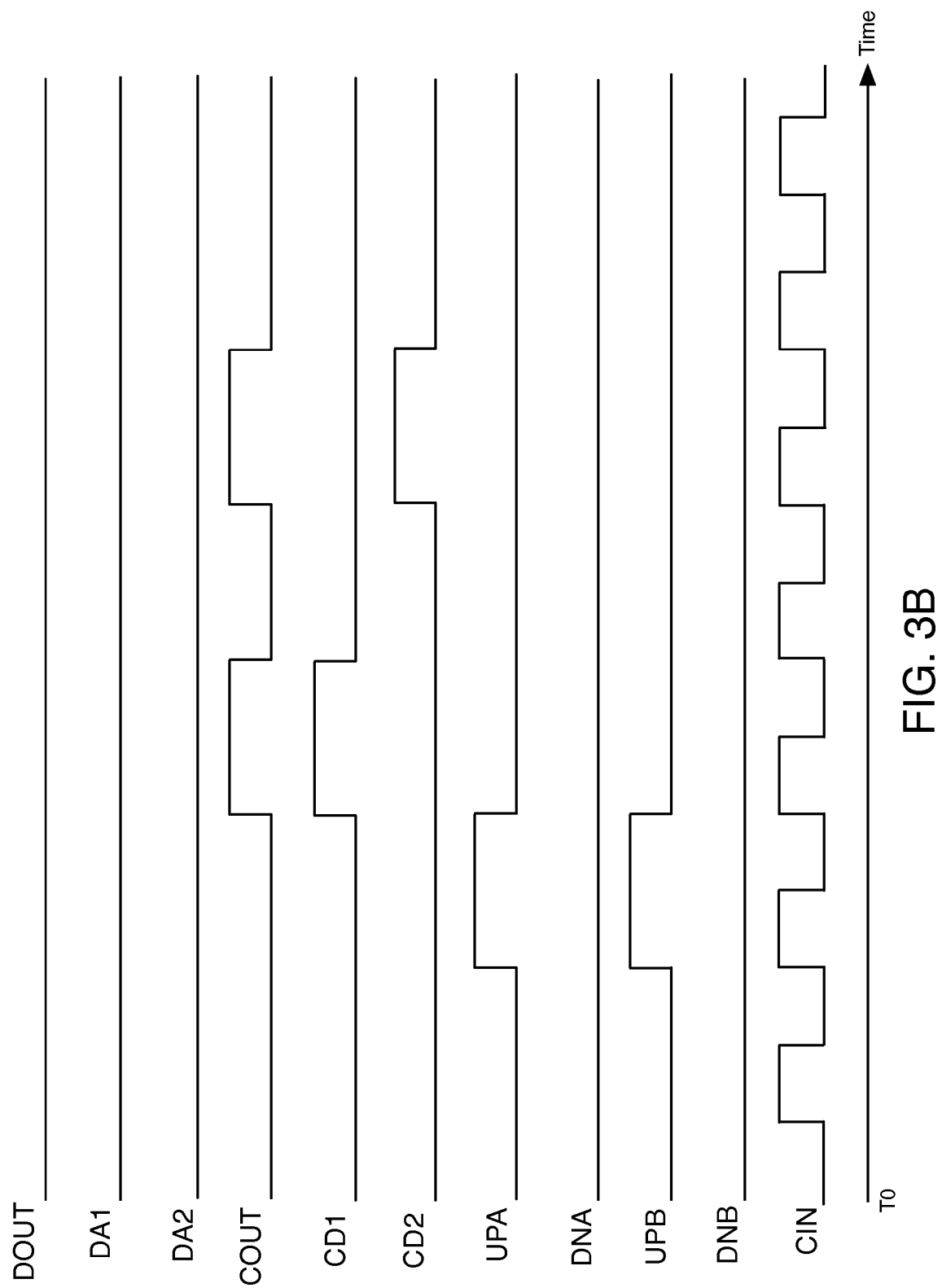

FIG. 3B is a timing diagram that illustrates exemplary waveforms for signals DOUT, DA1, DA2, COUT, CD1, CD2, UPA, DNA, UPB, DNB, and CIN shown in FIG. 2 when logic high pulses are generated in the UPA and UPB signals at the same time. In the example of FIG. 3B, signals DOUT, DA1, DA2, COUT, CD1, CD2, UPA, DNA, UPB, DNB, CIN, Z1-Z2, P1-P2, Y1-Y2, J142, and the signals at the Q outputs of flip-flop circuits 211-212 and 221-222 are all in logic low states at start time T0.

At time T0, the output signals of NAND logic gates 232 and 242 at the CLR inputs of flip-flop circuits 213 and 223 are in logic high states, causing signals CD1 and CD2 to be in logic low states, respectively. In response to a rising edge in signal UPA after time T0, flip-flop circuit 212 generates a rising edge in the signal stored at its Q output. In response to the rising edge in the signal at the Q output of flip-flop circuit 212, NOR logic gate circuit 217 maintains its output signal DA1 in a logic low state, as shown in FIG. 3B, and OR logic gate 218 generates a rising edge in signal Z1. In response to the rising edge in signal Z1, AND logic gate 231 generates a rising edge in signal P1.

In response to the rising edge in signal P1, NAND logic gate 232, inverter 244, and inverter 255 generate falling edges in their respective output signals. NAND logic gate 242 maintains its output signal K2 in a logic high state in response to the falling edge in the output signal of inverter 244. AND logic gate 252 maintains signal Y2 in a logic low state in response to the falling edge in the output signal of inverter 255. AND logic gate 251 maintains its output signal Y1 in a logic low state in response to the logic low state in signal DA1. OR gate circuit 261 maintains signal DOUT in a logic low state after the rising and falling edges in signals UPA and UPB, as shown in FIG. 3B, because both of its input signals Y1 and Y2 remain in logic low states.

In response to a rising edge in signal UPB after time T0, flip-flop circuit 222 generates a rising edge in the signal stored its Q output. In response to the rising edge in the signal at the Q output of flip-flop circuit 222, NOR logic gate circuit 227 maintains its output signal DA2 in a logic low state, as shown in FIG. 3B, and OR logic gate 228 generates a rising edge in signal Z2. In response to the rising edge in signal Z2, AND logic gate 241 generates a rising edge in signal P2.

NAND logic gate 232 generates a falling edge in signal K1 following the rising edge in signal UPA. On the first rising edge in clock signal CIN that occurs after the falling edge in signal K1, flip-flop circuit 213 generates a rising edge in signal CD1, as shown in FIG. 3B, and a falling edge in the signal at its inverting Q bar output. OR gate 262 generates a rising edge in its output signal COUT in response to the rising edge in its input signal CD1, as shown in FIG. 3B. On the second rising edge in clock signal CIN that occurs after the falling edge in signal K1, flip-flop circuit 213 generates a falling edge in signal CD1 as shown in FIG. 3B and a rising edge in the signal at its inverting Q bar output, and flip-flop circuit 214 generates a rising edge in signal J1. OR gate 262 generates a falling edge in signal COUT in response to the falling edge in signal CD1, as shown in FIG. 3B.

In response to the rising edge in signal J1, flip-flop circuit 212 generates a falling edge in the signal stored at its Q output. The signal at the Q output of flip-flop circuit 211 remains in a logic low state. In response to the falling edge in the signal at the Q output of flip-flop circuit 212, OR logic gate 218 generates a falling edge in its output signal Z1, which causes AND logic gate 231 to generate a falling edge in signal P1.

In response to the falling edge in signal P1, NAND logic gate 232 generates a rising edge in signal K1, causing signal CD1 to remain in a logic low state after subsequent rising edges in clock signal CIN. After the falling edge in signal P1, both input signals of NAND logic gate 242 are in logic high states, and NAND logic gate 242 generates falling edge in signal K2.

On the first rising edge in clock signal CIN that occurs after the falling edge in signal K2, flip-flop circuit 223 generates a rising edge in signal CD2, as shown in FIG. 3B and a falling edge in the signal at its inverting Q bar output. OR gate 262 generates a second rising edge in its output signal COUT in response to the rising edge in its signal CD2, as shown in FIG. 3B. On the second rising edge in clock signal CIN that occurs after the falling edge in signal K2, flip-flop circuit 223 generates a falling edge in signal CD2 as shown in FIG. 3B and a rising edge in the signal at its inverting Q bar output, and flip-flop circuit 224 generates a rising edge in signal J2. OR gate 262 generates a second falling edge in its output signal COUT in response to the falling edge in signal CD2, as shown in FIG. 3B.

In response to the rising edge in signal J2, flip-flop circuit 222 generates a falling edge in the signal stored at its Q output. The signal at the Q output of flip-flop circuit 221 remains in a logic low state. In response to the falling edge in the signal at the Q output of flip-flop circuit 222, OR logic gate 228 generates a falling edge in signal Z2, which causes AND logic gate 241 to generate a falling edge in signal P2. In response to the falling edge in signal P2, NAND logic gate 242 generates a rising edge in signal K2, causing signal CD2 to remain in a logic low state after subsequent rising edges in clock signal CIN.

As shown in FIG. 3B, anti-collision circuit 200 generates two logic high pulses in output signal COUT in response to concurrent logic high pulses in signals UPA and UPB. Each of the two logic high pulses in signal COUT equals one period of clock signal CIN. Signal DOUT is in a logic low state for the duration of both of the logic high pulses in signal COUT.

Counter circuit 105 decreases the value of the count signals CNT by two in response to the two rising edges in signal COUT shown in FIG. 3B that occur while signal DOUT is in a logic low state. Each rising edge in signal COUT occurs in a different period of clock signal CIN. PI circuit 106 shifts the phase of each of the recovered clock signals to occur earlier in time by the minimum phase shift in response to each decrease of one in the value of count signals CNT.

PI circuit 106 shifts the phases of the recovered clock signals by the minimum phase shift in response to the first decrease of 1 in the CNT signals. Subsequently, PI circuit 106 shifts the phases of the recovered clock signals by the minimum phase shift in response to the second decrease of 1 in the CNT signals. CDR circuit 100 generates a total phase shift in each of the recovered clock signals equal to twice the minimum phase shift of PI circuit 106 in response to concurrent logic high pulses in signals UPA and UPB. The total phase shift is spread out over multiple periods of clock signal CIN to reduce the quantization error.

Figure 4:
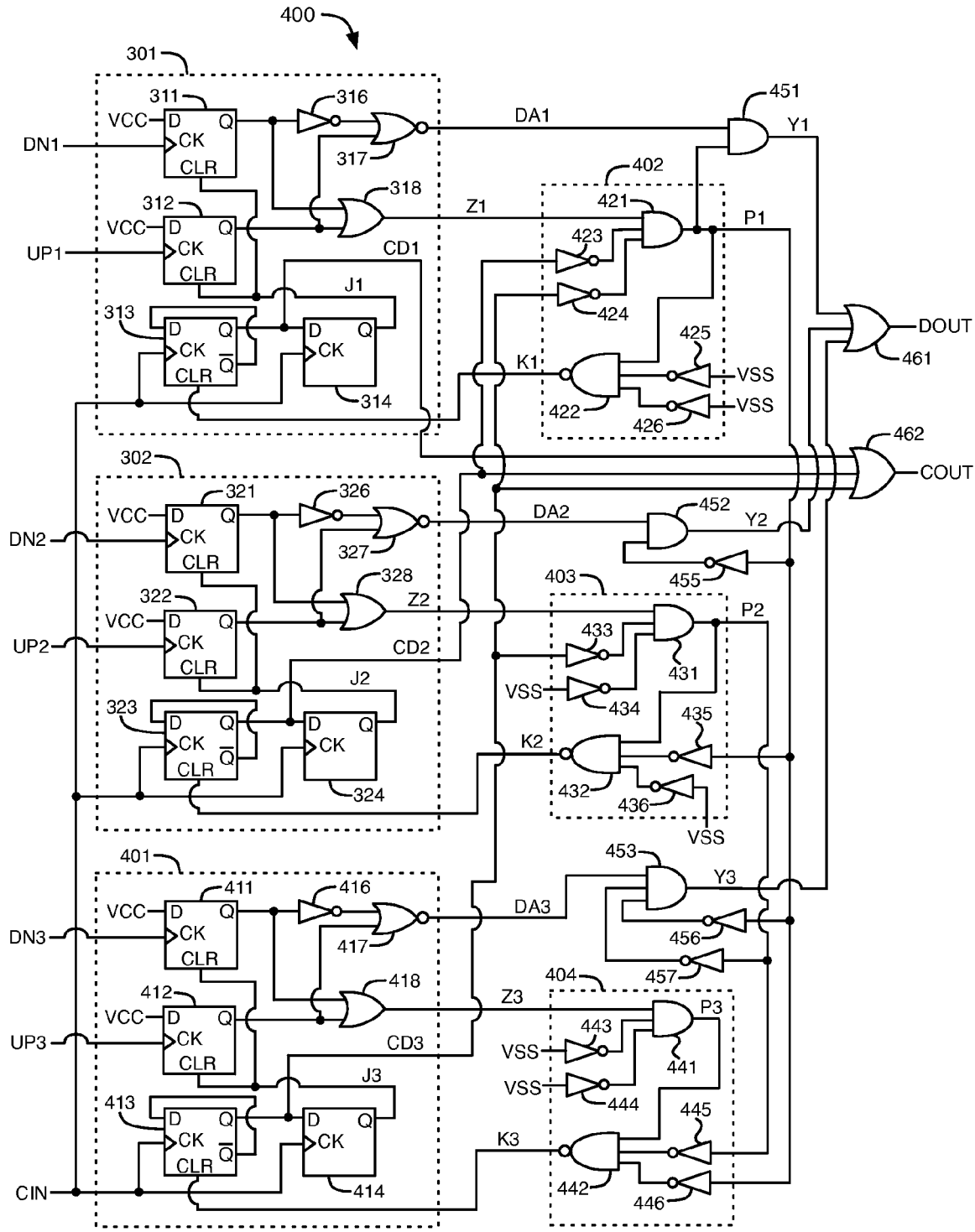
FIG. 4 illustrates another example of an anti-collision circuit.

FIG. 4 illustrates an example of an anti-collision circuit 400. Anti-collision circuit 400 includes storage circuits 301-302 and 401, priority control circuits 402-404, AND logic gate circuits 451-453, inverter circuits 455-457, and OR logic gate circuits 461-462. Storage circuit 301 includes D flip-flop circuits 311-314, inverter circuit 316, NOR logic gate circuit 317, and OR logic gate circuit 318. Storage circuit 302 includes D flip-flop circuits 321-324, inverter circuit 326, NOR logic gate circuit 327, and OR logic gate circuit 328. Storage circuit 401 includes D flip-flop circuits 411-414, inverter circuit 416, NOR logic gate circuit 417, and OR logic gate circuit 418.

Priority control circuit 402 includes AND logic gate circuit 421, NAND logic gate circuit 422, and inverter circuits 423-426. Priority control circuit 403 includes AND logic gate circuit 431, NAND logic gate circuit 432, and inverter circuits 433-436. Priority control circuit 404 includes AND logic gate circuit 441, NAND logic gate circuit 442, and inverter circuits 443-446.

In an embodiment, anti-collision circuit 400 is in anti-collision circuit 104 shown in FIG. 1, and digital filter 102 and SSC circuit 103 generate the UP1, UP2, UP3, DN1, DN2, and DN3 signals shown in FIG. 4. In anti-collision circuit 400, signal DN1 is provided to the clock (CK) input of flip-flop circuit 311, signal UP1 is provided to the clock (CK) input of flip-flop circuit 312, signal DN2 is provided to the clock (CK) input of flip-flop circuit 321, signal UP2 is provided to the clock (CK) input of flip-flop circuit 322, signal DN3 is provided to the clock (CK) input of flip-flop circuit 411, and signal UP3 is provided to the clock (CK) input of flip-flop circuit 412. Periodic clock signal CIN is provided to the clock (CK) inputs of flip-flop circuits 313-314, 323-324, and 413-414. A supply voltage VCC that represents a logic high state is provided to the D inputs of flip-flop circuits 311-312, 321-322, and 411-412. A ground voltage VSS that represents a logic low state is provided to the inputs of inverter circuits 425-426, 434, 436, and 443-444.

Figure 5A:
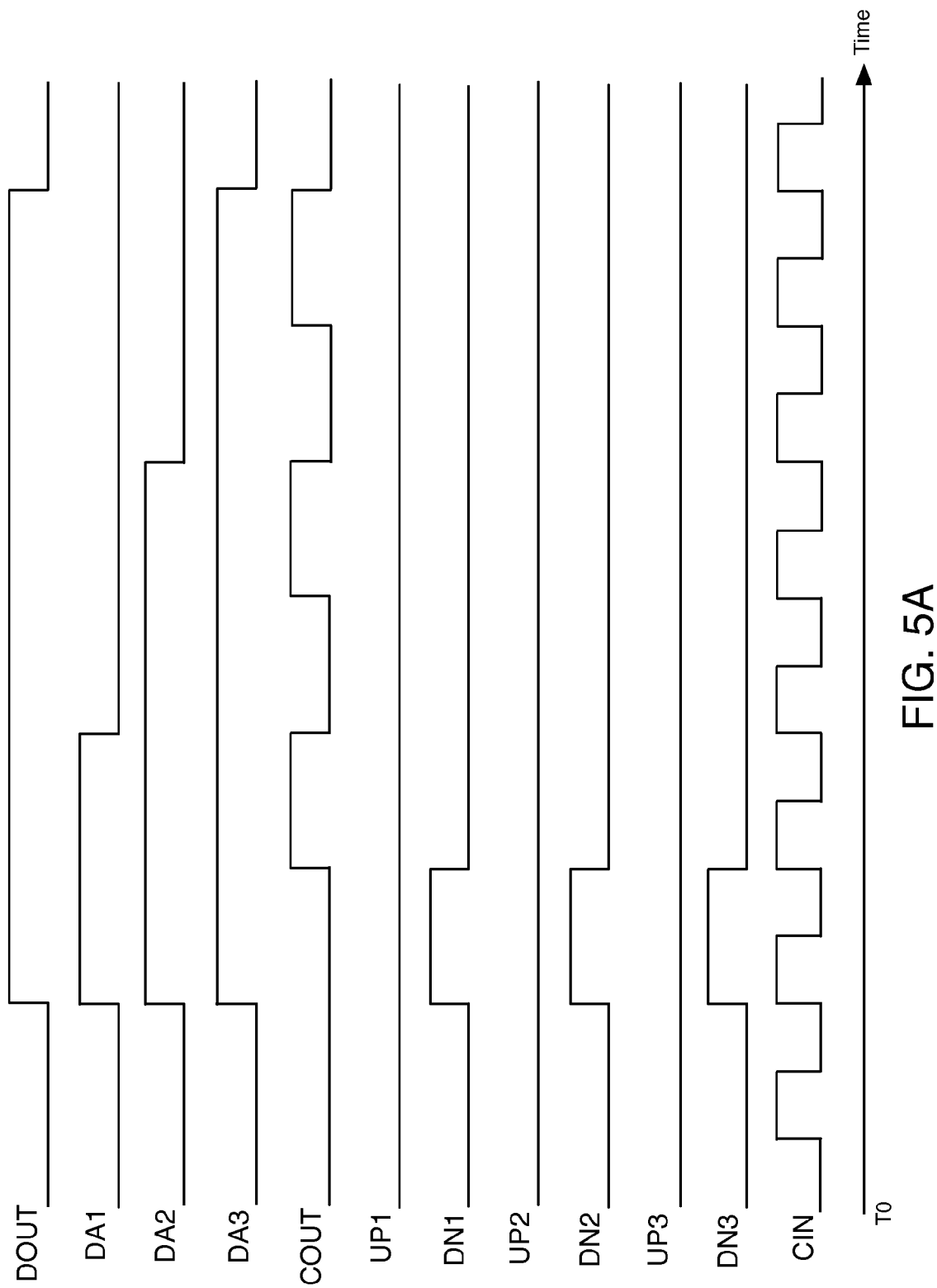
FIGS. 5A-5B are timing diagrams that illustrate exemplary waveforms for signals shown in FIG. 4.

FIG. 5A is a timing diagram that illustrates exemplary waveforms for signals DOUT, DA1, DA2, DA3, COUT, UP1, DN1, UP2, DN2, UP3, DN3, and CIN shown in FIG. 4 when concurrent logic high pulses are generated in signals DN1, DN2, and DN3. In the example of FIG. 5A, signals DOUT, DA1, DA2, DA3, COUT, UP1, DN1, UP2, DN2, UP3, DN3, CIN, Z1-Z3, P1-P3, Y1-Y3, J143, CD1-CD3, and the signals stored at the Q outputs of flip-flop circuits 311-312, 321-322, and 411-412 are all in logic low states at start time T0.

Each of inverters 425-426, 434, 436, and 443-444 generates an output signal in a logic high state in response to input ground voltage VSS. Therefore, AND logic gate 441 causes its output signal P3 to have the same logic state as its input signal Z3, and NAND logic gate 422 functions as an inverter. When the output signals P1-P3 of AND logic gates 421, 431, and 441, respectively, are in logic low states at time T0, NAND logic gates 422, 432, and 442 generate output signals K1-K3 having logic high states at the clear (CLR) inputs of flip-flop circuits 313, 323, and 413, respectively. While signals K1-K3 are in logic high states, flip-flop circuits 313, 323, and 413 maintain the signals CD1, CD2, and CD3, respectively, at their Q outputs in logic low states and the signals at their inverting Q bar outputs in logic high states.

In response to the concurrent rising edges in signals DN1, DN2, and DN3 after time T0, flip-flop circuits 311, 321, and 411 generate rising edges in the signals stored at their Q outputs, inverters 316, 326, and 416 generate falling edges in their output signals, NOR logic gates 317, 327, and 417 generate rising edges in signals DA1-DA3 as shown in FIG. 5A, and OR logic gates 318, 328, and 418 generate rising edges in signals Z1-Z3, respectively.

The output signals of inverters 423-424 and 433 are in logic high states, because signals CD2 and CD3 are in logic low states at the rising edges of signals DN1-DN3. Therefore, AND logic gates 421, 431, and 441 generate rising edges in signals P1, P2, and P3 in response to the rising edges in signals Z1, Z2, and Z3, respectively. AND logic gate 451 generates a rising edge in signal Y1 in response to the rising edges in signals DA1 and P1. OR logic gate 461 generates a rising edge in signal DOUT in response to the rising edge in signal Y1, as shown in FIG. 5A. The output signals of inverters 455-457 are in logic low states in response to the logic high states in signals P1-P2.

After the rising edge in signal P1, NAND logic gate circuit 422 generates a falling edge in its output signal K1 at the CLR input of flip-flop circuit 313. In response to the first rising edge in clock signal CIN occurring after the falling edge in signal K1, flip-flop circuit 313 generates a rising edge in signal CD1 and a falling edge at its inverting Q bar output, which causes OR logic gate 462 to generate a rising edge in its output signal COUT, as shown in FIG. 5A. In response to the second rising edge in clock signal CIN occurring after the falling edge in signal K1, flip-flop circuit 313 generates a falling edge in signal CD1, and flip-flop circuit 314 generates a rising edge in signal J1 that clears flip-flop circuits 311-312, causing falling edges in signals DA1, Z1, P1 and Y1. OR logic gate 462 generates a falling edge in its output signal COUT in response to the falling edge in signal CD1, as shown in FIG. 5A. AND logic gate 452 generates a rising edge in its output signal Y2, because inverter 455 generates a rising edge in its output signal in response to the falling edge in signal P1. As a result, OR logic gate 461 maintains signal DOUT in a logic high state in response to rising edge in signal Y2, as shown in FIG. 5A.

In response to the falling edge in signal P1, inverter 435 generates a rising edge in its output signal, and NAND logic gate circuit 432 generates a falling edge in its output signal K2 at the CLR input of flip-flop circuit 323. In response to the first rising edge in clock signal CIN occurring after the falling edge in signal K2, flip-flop circuit 323 generates a rising edge in signal CD2 and a falling edge at its Q bar output, which causes OR logic gate 462 to generate the second rising edge in signal COUT shown in FIG. 5A. In response to the second rising edge in clock signal CIN occurring after the falling edge in signal K2, flip-flop circuit 323 generates a falling edge in signal CD2, and flip-flop circuit 324 generates a rising edge in signal J2 that clears flip-flop circuits 321-322, causing falling edges in signals DA2, Z2, P2 and Y2. OR logic gate 462 generates the second falling edge in its output signal COUT shown in FIG. 5A in response to the falling edge in signal CD2. Inverter 457 generates a rising edge in its output signal in response to the falling edge in signal P2, causing AND logic gate 453 to generate a rising edge in its output signal Y3, because signal DA3 and the output signal of inverter 456 are in logic high states. As a result, OR logic gate 461 maintains signal DOUT in a logic high state in response to the rising edge in signal Y3, as shown in FIG. 5A.

After the falling edge in signal P1, the output signal of inverter 446 is in a logic high state. In response to the falling edge in signal P2, inverter 445 generates a rising edge in its output signal, and NAND logic gate circuit 442 generates a falling edge in its output signal K3 at the CLR input of flip-flop circuit 413. In response to the first rising edge in clock signal CIN occurring after the falling edge in signal K3, flip-flop circuit 413 generates a rising edge in signal CD3 and a falling edge at its inverting Q bar output, which causes OR logic gate 462 to generate the third rising edge in its output signal COUT shown in FIG. 5A. In response to the second rising edge in clock signal CIN occurring after the falling edge in signal K3, flip-flop circuit 413 generates a falling edge in signal CD3, and flip-flop circuit 414 generates a rising edge in signal J3 that clears flip-flop circuits 411-412, causing falling edges in signals DA3, Z3, P3 and Y3. OR logic gate 462 generates the third falling edge in its output signal COUT shown in FIG. 5A in response to the falling edge in signal CD3. AND logic gate 453 generates a falling edge in signal Y3 in response to the falling edge in signal DA3. OR logic gate 461 generates a falling edge in signal DOUT in response to the falling edge in signal Y3, as shown in FIG. 5A.

As shown in FIG. 5A, anti-collision circuit 400 generates 3 logic high pulses in output signal COUT that each have a duration of one period of clock signal CIN in response to concurrent rising edges in signals DN1-DN3. Each logic high pulse in signal COUT occurs in a different period of clock signal CIN. Signal DOUT is in a logic high state for the duration of the 3 logic high pulses in signal COUT. Therefore, counter circuit 105 increases the value of the count signals CNT by one in response to each of the 3 rising edges in signal COUT shown in FIG. 5A. PI circuit 106 increases the phase of each of the recovered clock signals to occur later in time by the minimum phase shift in response to each increase of one in the value of count signals CNT. CDR circuit 100 generates a total phase shift in each of the recovered clock signals equal to three times the minimum phase shift of PI circuit 106 in response to concurrent logic high pulses in signals DN1-DN3. The total phase shift is spread out over three periods of clock signal CIN to reduce the quantization error.

Figure 5B:
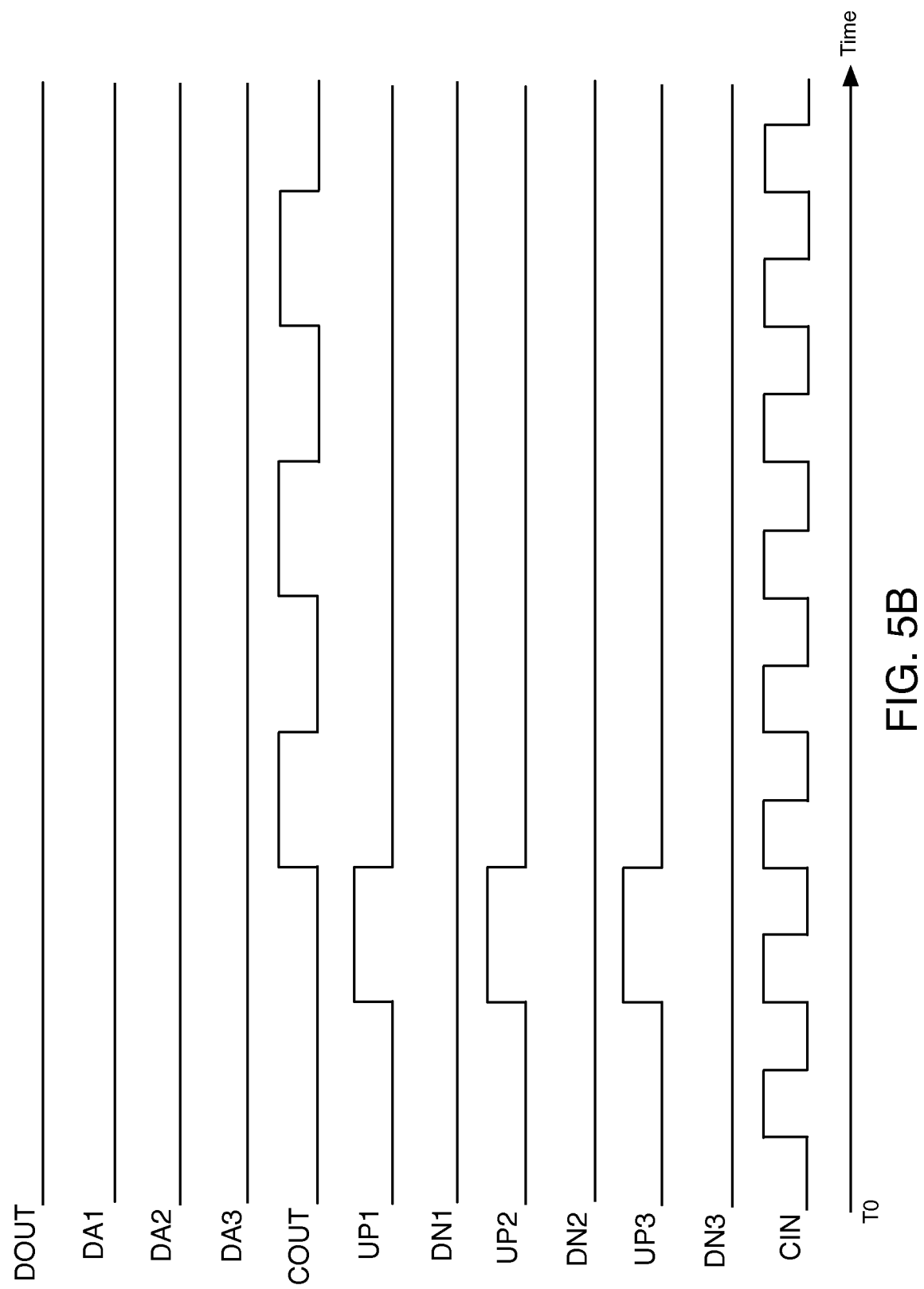

FIG. 5B is a timing diagram that illustrates exemplary waveforms for signals DOUT, DA1, DA2, DA3, COUT, UP1, DN1, UP2, DN2, UP3, DN3, and CIN shown in FIG. 4 when concurrent logic high pulses are generated in signals UP1, UP2, and UP3. In the example of FIG. 5B, signals DOUT, DA1-DA3, CD1-CD3, COUT, UP1, DN1, UP2, DN2, UP3, DN3, CIN, Z1-Z3, P1-P3, Y1-Y3, J143, and the signals stored at the Q outputs of flip-flop circuits 311-312, 321-322, and 411-412 are all in logic low states at start time T0.

In response to concurrently rising edges in signals UP1, UP2, and UP3 after time T0, flip-flop circuits 312, 322, and 412 generates rising edges in the signals stored at their Q outputs, OR logic gates 318, 328, and 418 generates rising edges in signals Z1, Z2, and Z3, and NOR logic gates 317, 327, and 417 maintain signals DA1, DA2, and DA3 in logic low states, respectively, as shown in FIG. 5B. AND logic gates 451-453 maintain their output signals Y1-Y3 in logic low states in response to the logic low states in signals DA1-DA3, respectively. OR logic gate 461 maintains signal DOUT in a logic low state in response to the logic low states of signals Y1-Y3 after time T0, as shown in FIG. 5B.

The output signals of inverters 423-424 and 433 are in logic high states, because signals CD2 and CD3 are in logic low states at the rising edges of signals UP1-UP3. Therefore, AND logic gates 421, 431, and 441 generate rising edges in signals P1, P2, and P3 in response to the rising edges in signals Z1, Z2, and Z3, respectively.

After the rising edge occurs in signal P1, NAND logic gate circuit 422 generates a falling edge in its output signal K1 at the CLR input of flip-flop circuit 313. After the falling edge in signal K1, storage circuit 301 generates a logic high pulse in signal CD1 that has a duration of one period of clock signal CIN. OR logic gate 462 then generates a first logic high pulse in signal COUT that has a duration of one period of clock signal CIN, as shown in FIG. 5B. Storage circuit 301 then generates a rising edge in signal J1, which clears flip-flop 312 and causes OR logic gate 318 to generate a falling edge in signal Z1. In response to the falling edge in signal Z1, AND logic gate 421 generates a falling edge in signal P1, and NAND logic gate 422 generates a rising edge in signal K1. The logic high state in signal K1 causes flip-flop 313 to maintain signal CD1 in a logic low state.

Inverter 435 generates a rising edge in its output signal in response to the falling edge in signal P1, which causes NAND logic gate circuit 432 to generate a falling edge in its output signal K2 at the CLR input of flip-flop circuit 323. After the falling edge in signal K2, storage circuit 302 generates a logic high pulse in signal CD2 that has a duration of one period of clock signal CIN. OR logic gate 462 then generates a second logic high pulse in signal COUT having a duration of one period of clock signal CIN, as shown in FIG. 5B. Storage circuit 302 then generates a rising edge in signal J2, which clears flip-flop 322 and causes OR gate 328 to generate a falling edge in signal Z2. In response to the falling edge in signal Z2, AND logic gate 431 generates a falling edge in signal P2, and NAND logic gate 432 generates a rising edge in signal K2. The logic high state in signal K2 causes flip-flop 323 to maintain signal CD2 in a logic low state.

Inverter 445 generates a rising edge in its output signal in response to the falling edge in signal P2, which causes NAND logic gate circuit 442 to generate a falling edge in its output signal K3 at the CLR input of flip-flop circuit 413. After the falling edge in signal K3, storage circuit 401 generates a logic high pulse in signal CD3 that has a duration of one period of clock signal CIN. OR logic gate 462 then generates a third logic high pulse in signal COUT having a duration of one period of signal CIN, as shown in FIG. 5B. Storage circuit 401 then generates a rising edge in signal J3, which clears flip-flop 412 and causes OR gate 418 to generate a falling edge in signal Z3. In response to the falling edge in signal Z3, AND logic gate 441 generates a falling edge in signal P3, and NAND logic gate 442 generates a rising edge in signal K3. The logic high state in signal K3 causes flip-flop 413 to maintain signal CD3 in a logic low state.

As shown in FIG. 5B, anti-collision circuit 400 generates 3 logic high pulses in output signal COUT that each have a duration of one period of clock signal CIN in response to concurrent logic high pulses in signals UP1-UP3. Each logic high pulse in signal COUT occurs in a different period of clock signal CIN. Signal DOUT is in a logic low state for the duration of the 3 logic high pulses in signal COUT. Therefore, counter circuit 105 decreases the value of count signals CNT by one in response to each of the 3 rising edges in signal COUT shown in FIG. 5B. PI circuit 106 decreases the phase of each of the recovered clock signals to occur earlier in time by the minimum phase shift in response to each decrease of one in the value of count signals CNT. CDR circuit 100 generates a total phase shift in each of the recovered clock signals equal to three times the minimum phase shift of PI circuit 106 in response to concurrent logic high pulses in signals UP1-UP3. The total phase shift is spread out over three periods of clock signal CIN to reduce the quantization error.

Figure 6:
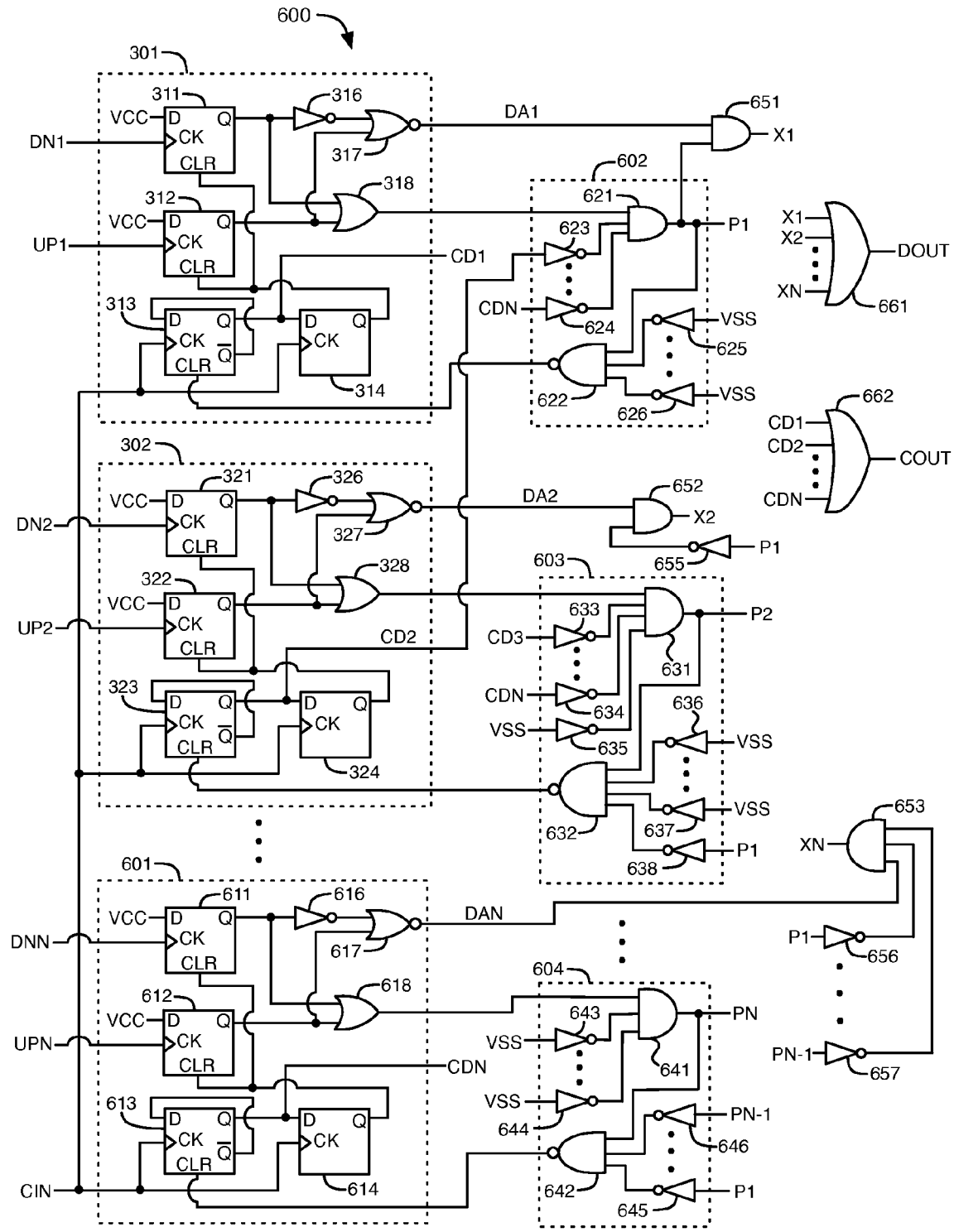
FIG. 6 illustrates another example of an anti-collision circuit.

FIG. 6 illustrates an example of an anti-collision circuit 600. Anti-collision circuit 600 has an N number of 3 or more storage circuits, including storage circuits 301-302 and 601. Anti-collision circuit 600 has an N number of 3 or more priority control circuits, including priority control circuits 602-604 and an N number of 3 or more AND logic gate circuits including AND logic gate circuits 651-653. Anti-collision circuit 600 further includes inverter circuits 655-657 and OR logic gate circuits 661-662.

Storage circuit 601 includes D flip-flop circuits 611-614, inverter circuit 616, NOR logic gate circuit 617, and OR logic gate circuit 618. Priority control circuit 602 includes AND logic gate circuit 621, NAND logic gate circuit 622, and inverter circuits 623-626. Priority control circuit 603 includes AND logic gate circuit 631, NAND logic gate circuit 632, and inverter circuits 633-638. Priority control circuit 604 includes AND logic gate circuit 641, NAND logic gate circuit 642, and inverter circuits 643-646.

Anti-collision circuit 600 receives an N number of 3 or more UP input signals including UP1, UP2, and UPN. Anti-collision circuit 600 receives an N number of 3 or more DN input signals including DN1, DN2, and DNN. In anti-collision circuit 600, signal DN1 is provided to the clock (CK) input of flip-flop circuit 311, signal UP1 is provided to the clock (CK) input of flip-flop circuit 312, signal DN2 is provided to the clock (CK) input of flip-flop circuit 321, signal UP2 is provided to the clock (CK) input of flip-flop circuit 322, signal DNN is provided to the clock (CK) input of flip-flop circuit 611, and signal UPN is provided to the clock (CK) input of flip-flop circuit 612. In an embodiment, anti-collision circuit 600 is in anti-collision circuit 104 shown in FIG. 1, and digital filter 102 and SSC circuit 103 generate the UP1, UP2, UPN, etc. signals and the DN1, DN2, DNN etc. signals shown in FIG. 6.

Periodic clock signal CIN is provided to the clock (CK) inputs of flip-flop circuits 313-314, 323-324, and 613-614. A supply voltage VCC that represents a logic high state is provided to the D inputs of flip-flop circuits 311-312, 321-322, and 611-612. A ground voltage VSS that represents a logic low state is provided to the inputs of inverter circuits 625 . . . 626, 635, 636 . . . 637, and 643 . . . 644. The output signals of inverters 625 . . . 626 are provided to inputs of NAND logic gate 622. The output signals of inverters 636 . . . 637 are provided to inputs of NAND logic gate 632. The output signals of inverters 643 . . . 644 are provided to inputs of AND logic gate 641.

The output signals CD1, CD2, . . . CDN of flip-flops 313, 323, . . . 613, respectively, are provided to inputs of OR logic gate 662. OR logic gate 662 generates output signal COUT at its output. The output signal DAN of storage circuit 601 and the output signals of inverters 656 . . . 657 that invert output signals (i.e., P1, P2, . . . PN−1) of the first N−1 priority control circuits are provided to inputs of AND logic gate 653. Signal PN−1 is an output signal of the second to last priority control circuit. AND logic gates 651, 652, . . . 653 generate output signals X1, X2, . . . XN, respectively, which are provided to inputs of OR logic gate 661. OR logic gate 661 generates output signal DOUT at its output.

The output signals CD2 ... CDN of flip-flops 323 ... 613 are provided to inputs of inverters 623 ... 624, respectively. The output signals of inverters 623 ... 624 are provided to inputs of AND logic gate 621. Output signals CD3 ... CDN are provided to inputs of inverters 633 ... 634, respectively. Signal CD3 is an output signal of a third storage circuit in anti-collision circuit 600. The output signals of inverters 633 ... 635 are provided to inputs of AND logic gate 631. The output signals P1 ... PN-1 of the first N-1 priority control circuits are provided to inputs of inverters 645 ... 646, respectively. The output signals of inverters 645 ... 646 are provided to inputs of NAND logic gate 642.

In response to concurrent logic high pulses in signals DN1, DN2, ... DNN, anti-collision circuit 600 generates an N number of logic high pulses in signal COUT that each have a duration of one period of clock signal CIN. Each logic high pulse in signal COUT occurs in a different period of clock signal CIN. Signal DOUT is in a logic high state for the duration of the N logic high pulses in signal COUT, and counter circuit 105 increases the value of the count signals CNT by one in response to each of the N rising edges in signal COUT. PI circuit 106 increases the phase of each of the recovered clock signals to occur later in time by the minimum phase shift in response to each increase of one in the value of count signals CNT. CDR circuit 100 generates a total phase shift in each of the recovered clock signals equal to N times the minimum phase shift of PI circuit 106 in response to concurrent logic high pulses in signals DN1-DNN.

In response to concurrent logic high pulses in signals UP1, UP2, ... UPN, anti-collision circuit 600 generates an N number of logic high pulses in signal COUT that each have a duration of one period of clock signal CIN. Each logic high pulse in signal COUT occurs in a different period of clock signal CIN. Signal DOUT is in a logic low state for the duration of the N logic high pulses in signal COUT, and counter circuit 105 decreases the value of the count signals CNT by one in response to each of the N rising edges in signal COUT. PI circuit 106 decreases the phase of each of the recovered clock signals to occur earlier in time by the minimum phase shift in response to each decrease of one in the value of count signals CNT. CDR circuit 100 generates a total phase shift in each of the recovered clock signals equal to N times the minimum phase shift of PI circuit 106 in response to concurrent logic high pulses in signals UP1-UPN.

Figure 7A:
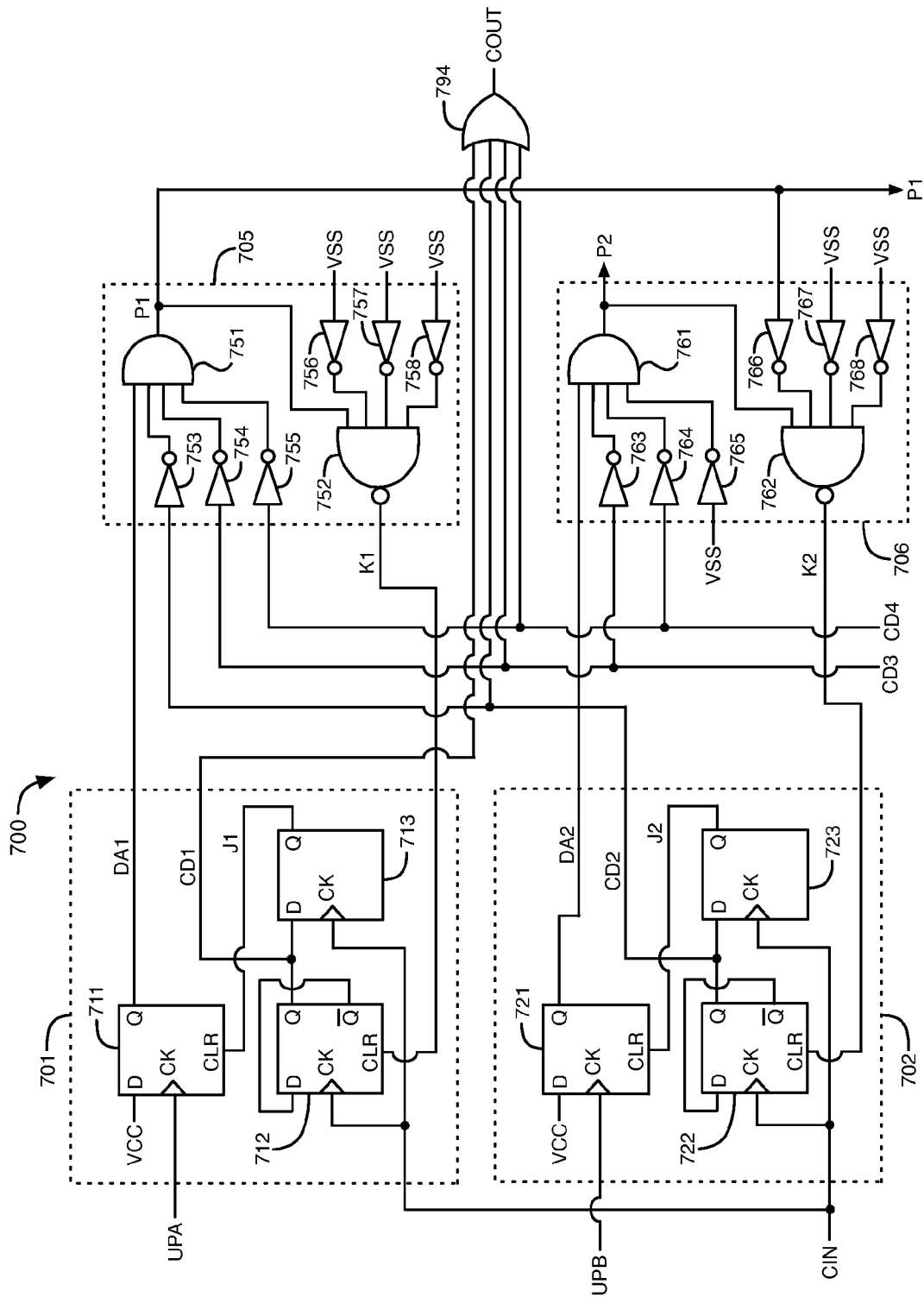
FIGS. 7A-7B illustrate another example of an anti-collision circuit.
Figure 7B:
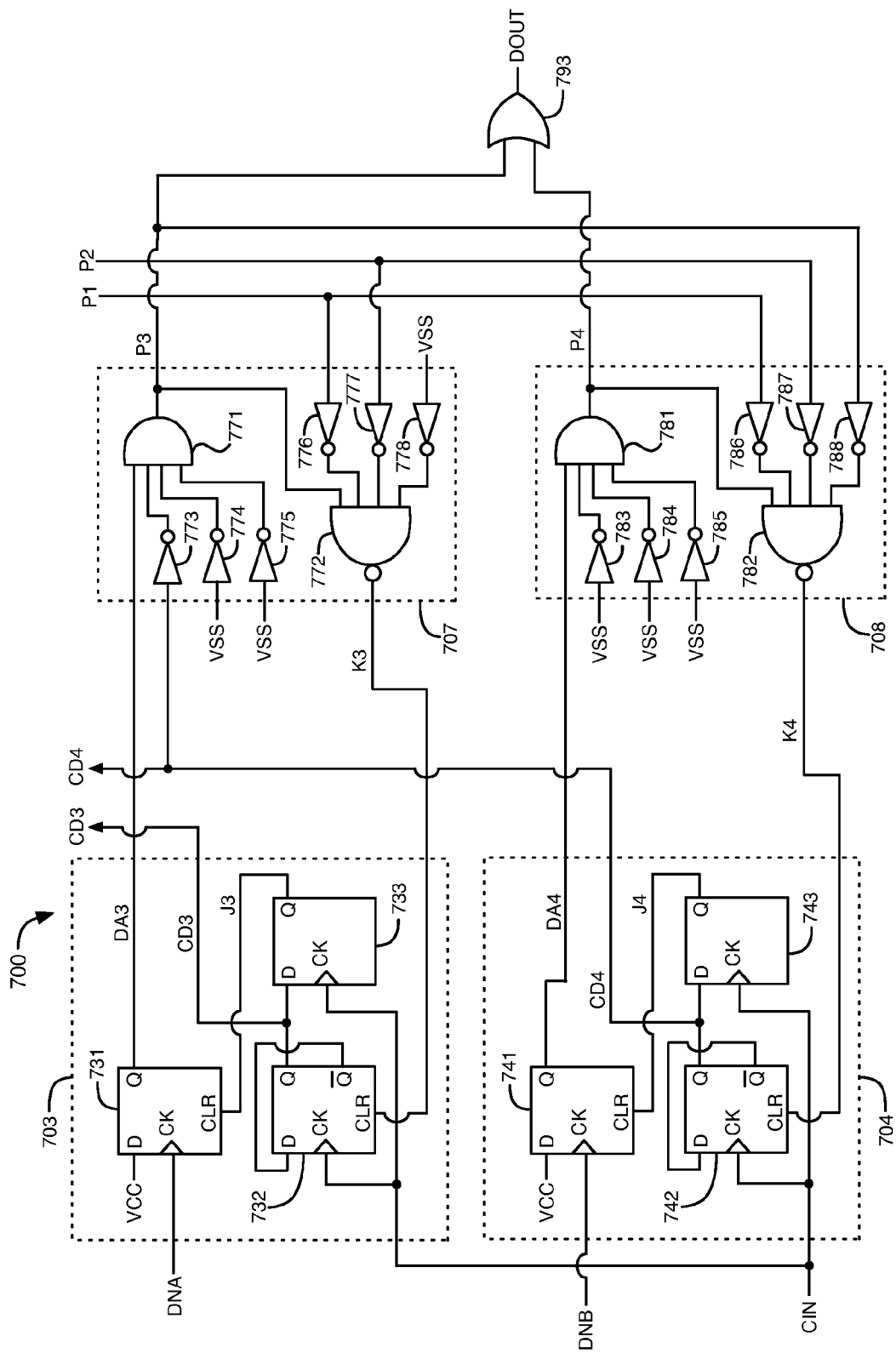

FIGS. 7A-7B illustrate another example of an anti-collision circuit 700. Anti-collision circuit 700 shown in FIGS. 7A and 7B includes storage circuits 701-704, priority control circuits 705-708, and OR logic gate circuits 793-794. Storage circuit 701 includes D flip-flop circuits 711-713. Storage circuit 702 includes D flip-flop circuits 721-723. Storage circuit 703 includes D flip-flop circuits 731-733. Storage circuit 704 includes D flip-flop circuits 741-743.

Priority control circuit 705 includes AND logic gate circuit 751, NAND logic gate circuit 752, and inverter circuits 753-758. Priority control circuit 706 includes AND logic gate circuit 761, NAND logic gate circuit 762, and inverter circuits 763-768. Priority control circuit 707 includes AND logic gate circuit 771, NAND logic gate circuit 772, and inverter circuits 773-778. Priority control circuit 708 includes AND logic gate circuit 781, NAND logic gate circuit 782, and inverter circuits 783-788.

As shown in FIG. 7A, an input signal UPA is provided to the clock (CK) input of flip-flop circuit 711, and an input signal UPB is provided to the clock (CK) input of flip-flop circuit 721. As shown in FIG. 7B, an input signal DNA is provided to the clock (CK) input of flip-flop circuit 731, and an input signal DNB is provided to the clock (CK) input of flip-flop circuit 741. Periodic clock signal CIN is provided to the clock (CK) inputs of flip-flop circuits 712-713, 722-723, 732-733, and 742-743. A supply voltage VCC that represents a logic high state is provided to the D inputs of flip-flop circuits 711, 721, 731, and 741. A ground voltage VSS that represents a logic low state is provided to the inputs of inverter circuits 756-758, 765, 767-768, 774-775, 778, and 783-785. Inverter circuits 756-758, 765, 767-768, 774-775, 778, and 783-785 generate logic high states in their output signals in response to input voltage VSS.

According to some embodiments, anti-collision circuit 700 is in anti-collision circuit 104 in FIG. 1. In one example of anti-collision circuit 700 being used to implement anti-collision circuit 104, signal UPA is signal UP1, signal UPB is signal UP2, signal DNA is signal DN1, and signal DNB is signal DN2. In another example of anti-collision circuit 700 being used to implement anti-collision circuit 104, signal UPA is signal UP2, signal UPB is signal UP3, signal DNA is signal DN2, and signal DNB is signal DN3.

Figure 8A:
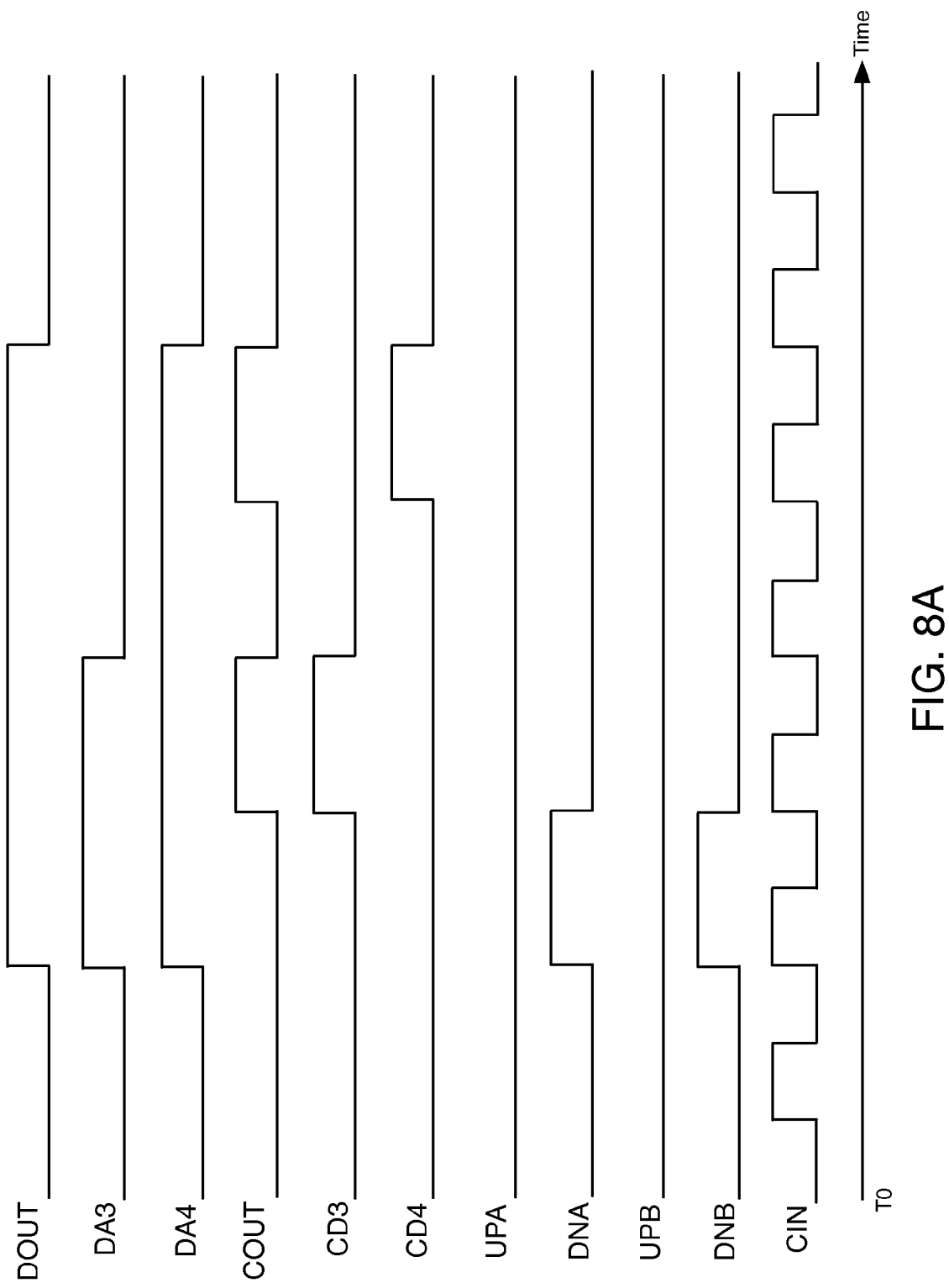
FIGS. 8A-8B are timing diagrams that illustrate exemplary waveforms for signals shown in FIGS. 7A-7B.

FIG. 8A is a timing diagram that illustrates exemplary waveforms for signals DOUT, DA3, DA4, COUT, CD3, CD4, UPA, DNA, UPB, DNB, and CIN shown in FIGS. 7A-7B when logic high pulses are generated in the DNA and DNB signals at the same time. In the example of FIG. 8A, signals DOUT, DA1-DA4, COUT, CD1-CD4, UPA, DNA, UPB, DNB, CIN, P1-P4, and J1-J4 are all in logic low states at start time T0.

When signals P1-P4 are in logic low states, NAND logic gates 752, 762, 772, and 782 generate logic high states in the signals K1-K4 at the clear (CLR) inputs of flip-flop circuits 712, 722, 732, and 742, respectively. While signals K1-K4 are in logic high states, flip-flop circuits 712, 722, 732, and 742 maintain the signals CD1, CD2, CD3, and CD4, respectively, at their Q outputs in logic low states and the signals at their inverting Q bar outputs in logic high states.

In response to concurrently rising edges in signals DNA and DNB after time T0 as shown in FIG. 8A, flip-flop circuits 731 and 741 generate rising edges in the signals DA3 and DA4, respectively, stored at their Q outputs. Signal CD4 is in a logic low state after time T0, which causes inverter circuit 773 to generate a logic high state in its output signal. AND logic gates 771 and 781 generate rising edges in their output signals P3 and P4 in response to the rising edges in signals DA3 and DA4, respectively, because the other input signals to AND logic gates 771 and 781 are already in logic high states. Signals P3 and P4 are provided to inputs of OR logic gate 793. OR logic gate 793 generates a rising edge in its output signal DOUT in response to the rising edges in signals P3-P4, as shown in FIG. 8A.

Signals P1 and P2 are in logic low states after time T0, causing inverter circuits 776-777 and 786-787 to generate logic high states in their output signals. In response to the rising edge in signal P3 that occurs after the rising edge in signal DNA, NAND logic gate 772 generates a falling edge in its output signal K3 at the CLR input of flip-flop circuit 732. On the first rising edge in clock signal CIN that occurs after the falling edge in signal K3, flip-flop circuit 732 generates a rising edge in the signal CD3 stored at its Q output, as shown in FIG. 8A, and a falling edge in the signal stored at its inverting Q bar output. Signals CD1-CD4 are provided to inputs of OR logic gate 794, as shown in FIG. 7A. OR logic gate 794 generates a rising edge in its output signal COUT in response to the rising edge in signal CD3, as shown in FIG. 8A.

On the second rising edge in clock signal CIN that occurs after the falling edge in signal K3, flip-flop circuit 732 generates a falling edge in signal CD3 as shown in FIG. 8A and a rising edge in the signal stored at its inverting Q bar output, and flip-flop circuit 733 generates a rising edge in the signal J3 stored at its Q output based on the previous logic high state in signal CD3. OR logic gate 794 generates a falling edge in its output signal COUT in response to the falling edge in signal CD3, as shown in FIG. 8A. Signal J3 is provided to the clear (CLR) input of flip-flop circuit 731. In response to the rising edge in signal J3, flip-flop circuit 731 generates a falling edge in signal DA3. In response to the falling edge in signal DA3, AND logic gate 771 generates a falling edge in signal P3. In response to the falling edge in signal P3, NAND logic gate 772 generates a rising edge in signal K3, which causes flip-flop circuit 732 to clear signal CD3 to a logic low state. Signals P4 and DOUT are in logic high states after the falling edge in signal P3.

In response to the falling edge in signal P3, inverter 788 generates a rising edge in its output signal. In response to all of the input signals of NAND logic gate 782 being in logic high states, NAND logic gate 782 generates a falling edge in its output signal K4 at the CLR input of flip-flop circuit 742. On the first rising edge in clock signal CIN that occurs after the falling edge in signal K4, flip-flop circuit 742 generates a rising edge in the signal CD4 stored at its Q output, as shown in FIG. 8A, and a falling edge in the signal stored at its Q bar output. OR logic gate 794 generates a second rising edge in signal COUT in response to the rising edge in signal CD4, as shown in FIG. 8A.

On the second rising edge in clock signal CIN that occurs after the falling edge in signal K4, flip-flop circuit 742 generates a falling edge in signal CD4 as shown in FIG. 8A and a rising edge in the signal stored at its Q bar output, and flip-flop circuit 743 generates a rising edge in the signal J4 stored at its Q output based on the previous logic high state in signal CD4. OR logic gate 794 generates a second falling edge in signal COUT in response to the falling edge in signal CD4, as shown in FIG. 8A. Signal J4 is provided to the clear (CLR) input of flip-flop circuit 741. In response to the rising edge in signal J4, flip-flop circuit 741 generates a falling edge in signal DA4. In response to the falling edge in signal DA4, AND logic gate 781 generates a falling edge in signal P4. In response to the falling edge in signal P4, NAND logic gate 782 generates a rising edge in signal K4, which causes flip-flop circuit 742 to clear signal CD4 to a logic low state. Also, in response to the falling edge in signal P4, OR logic gate 793 generates a falling edge in signal DOUT, as shown in FIG. 8A.

Counter circuit 105 increases the value of the count signals CNT by two in response to the two rising edges in signal COUT shown in FIG. 8A that occur while signal DOUT is in a logic high state. PI circuit 106 increases the phase of each of the recovered clock signals to occur later in time by the minimum phase shift of PI circuit 106 in response to each increase of one in the value of signals CNT. CDR circuit 100 generates a total phase shift in each of the recovered clock signals equal to twice the minimum phase shift in response to concurrent logic high pulses in signals DNA and DNB. The total phase shift is spread out over multiple periods of clock signal CIN to reduce the quantization error, because each rising edge in signal COUT occurs in a different period of clock signal CIN.

Figure 8B:
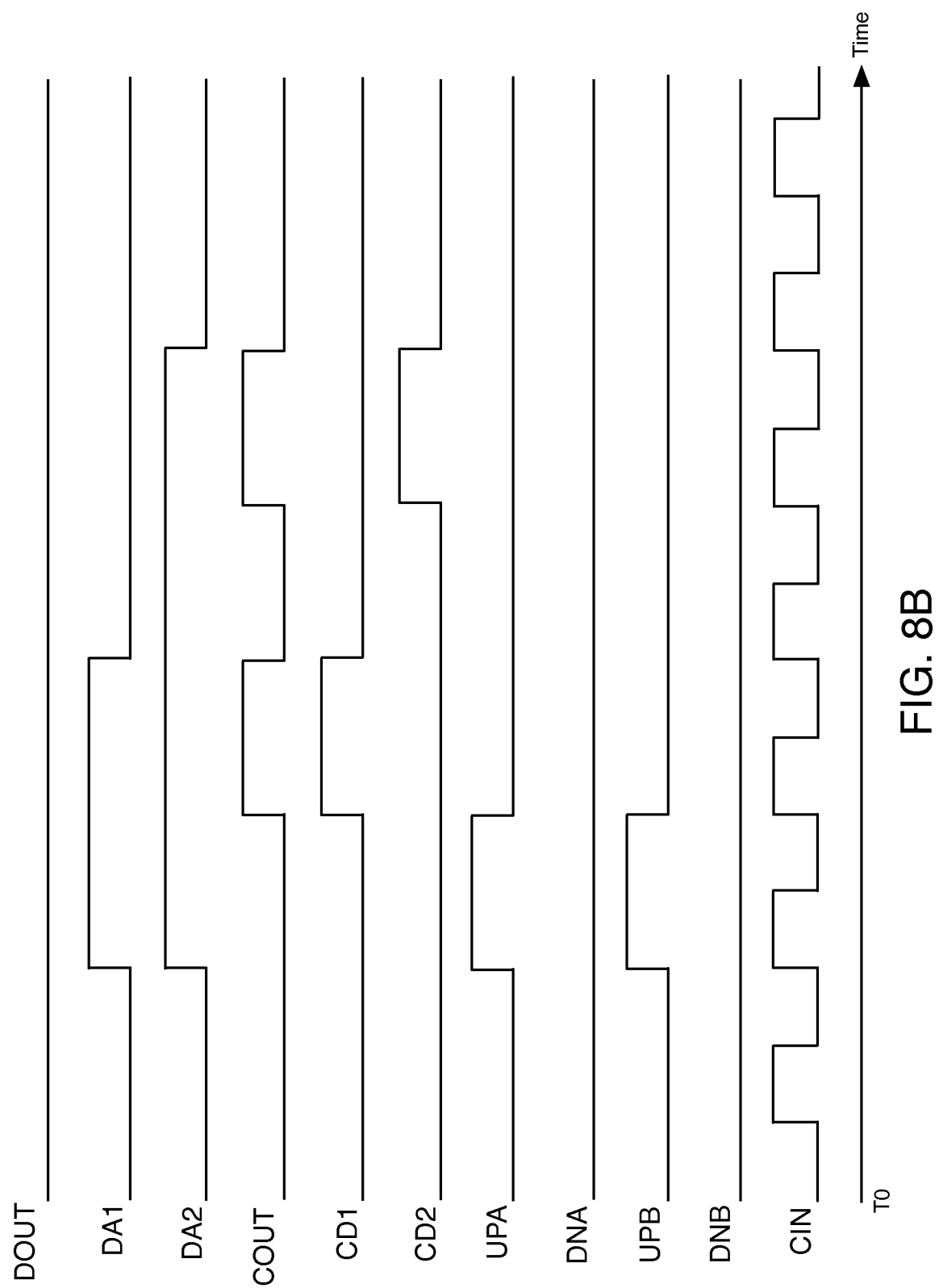

FIG. 8B is a timing diagram that illustrates exemplary waveforms for signals DOUT, DA1, DA2, COUT, CD1, CD2, UPA, DNA, UPB, DNB, and CIN shown in FIGS. 7A-7B when logic high pulses are generated in the UPA and UPB signals at the same time. In the example of FIG. 8B, signals DOUT, DA1-DA4, COUT, CD1-CD4, UPA, DNA, UPB, DNB, CIN, P1-P4, and J1-J4 are all in logic low states at start time T0.

At time T0, signals K1-K4 are in logic high states, causing flip-flop circuits 712, 722, 732, and 742 to maintain signals CD1-CD4, respectively, in logic low states. In response to concurrently rising edges in signals UPA and UPB after time T0, flip-flop circuits 711 and 721 generate rising edges in the signals DA1 and DA2, respectively, stored at their Q outputs, as shown in FIG. 8B. Because signals CD2-CD4 are in logic low states after time T0, inverter circuits 753-755 and 763-764 generate logic high states in their output signals. AND logic gates 751 and 761 generate rising edges in their output signals P1 and P2 in response to the rising edges in signals DA1 and DA2, respectively. OR logic gate circuit 793 maintains signal DOUT in a logic low state after the rising edges in signals UPA and UPB as shown in FIG. 8B.

In response to the rising edge in signal P1 that occurs after the rising edge in signal UPA, NAND logic gate 752 generates a falling edge in signal K1 at the CLR input of flip-flop circuit 712. On the first rising edge in clock signal CIN that occurs after the falling edge in signal K1, flip-flop circuit 712 generates a rising edge in the signal CD1 stored at its Q output, as shown in FIG. 8B, and a falling edge in the signal stored at its Q bar output. OR logic gate 794 generates a rising edge in its output signal COUT in response to the rising edge in signal CD1, as shown in FIG. 8B.

On the second rising edge in clock signal CIN that occurs after the falling edge in signal K1, flip-flop circuit 712 generates a falling edge in signal CD1 as shown in FIG. 8B and a rising edge in the signal stored at its Q bar output, and flip-flop circuit 713 generates a rising edge in the signal J1 stored at its Q output based on the previous logic high state in signal CD1. OR gate 794 generates a falling edge in its output signal COUT in response to the falling edge in signal CD1, as shown in FIG. 8B. Signal J1 is provided to the clear (CLR) input of flip-flop circuit 711. In response to the rising edge in signal J1, flip-flop circuit 711 generates a falling edge in signal DA1, which causes AND logic gate 751 to generate a falling edge in signal P1. In response to the falling edge in signal P1, NAND logic gate 752 generates a rising edge in signal K1, which causes flip-flop circuit 712 to clear signal CD1 to a logic low state.

In response to the falling edge in signal P1, inverter 766 generates a rising edge in its output signal. In response to all of the input signals of NAND logic gate 762 being in logic high states, NAND logic gate 762 generates a falling edge in its output signal K2 at the CLR input of flip-flop circuit 722. On the first rising edge in clock signal CIN that occurs after the falling edge in signal K2, flip-flop circuit 722 generates a rising edge in the signal CD2 stored at its Q output, as shown in FIG. 8B, and a falling edge in the signal stored at its Q bar output. OR logic gate 794 generates a second rising edge in its output signal COUT in response to the rising edge in signal CD2, as shown in FIG. 8B.

On the second rising edge in clock signal CIN that occurs after the falling edge in signal K2, flip-flop circuit 722 generates a falling edge in signal CD2 as shown in FIG. 8B and a rising edge in the signal stored at its Q bar output, and flip-flop circuit 723 generates a rising edge in the signal J2 stored at its Q output based on the previous logic high state in signal CD2. OR gate 794 generates a second falling edge in its output signal COUT in response to the falling edge in signal CD2, as shown in FIG. 8B. Signal J2 is provided to the clear (CLR) input of flip-flop circuit 721. In response to the rising edge in signal J2, flip-flop circuit 721 generates a falling edge in signal DA2. In response to the falling edge in signal DA2, AND logic gate 761 generates a falling edge in signal P2. In response to the falling edge in signal P2, NAND logic gate 762 generates a rising edge in signal K2, which causes flip-flop circuit 722 to clear signal CD2 to a logic low state.

Counter circuit 105 decreases the value of the count signals CNT by two in response to the two rising edges in signal COUT shown in FIG. 8B that occur while signal DOUT is in a logic low state. PI circuit 106 shifts the phase of each of the recovered clock signals to occur earlier in time by the minimum phase shift of PI circuit 106 in response to each decrease of one in the value of count signals CNT. CDR circuit 100 generates a total phase shift in each of the recovered clock signals equal to twice the minimum phase shift in response to concurrent logic high pulses in signals UPA and UPB. The total phase shift is spread out over multiple periods of clock signal CIN to reduce the quantization error, because each rising edge in signal COUT occurs in a different period of clock signal CIN.

Figure 9A:
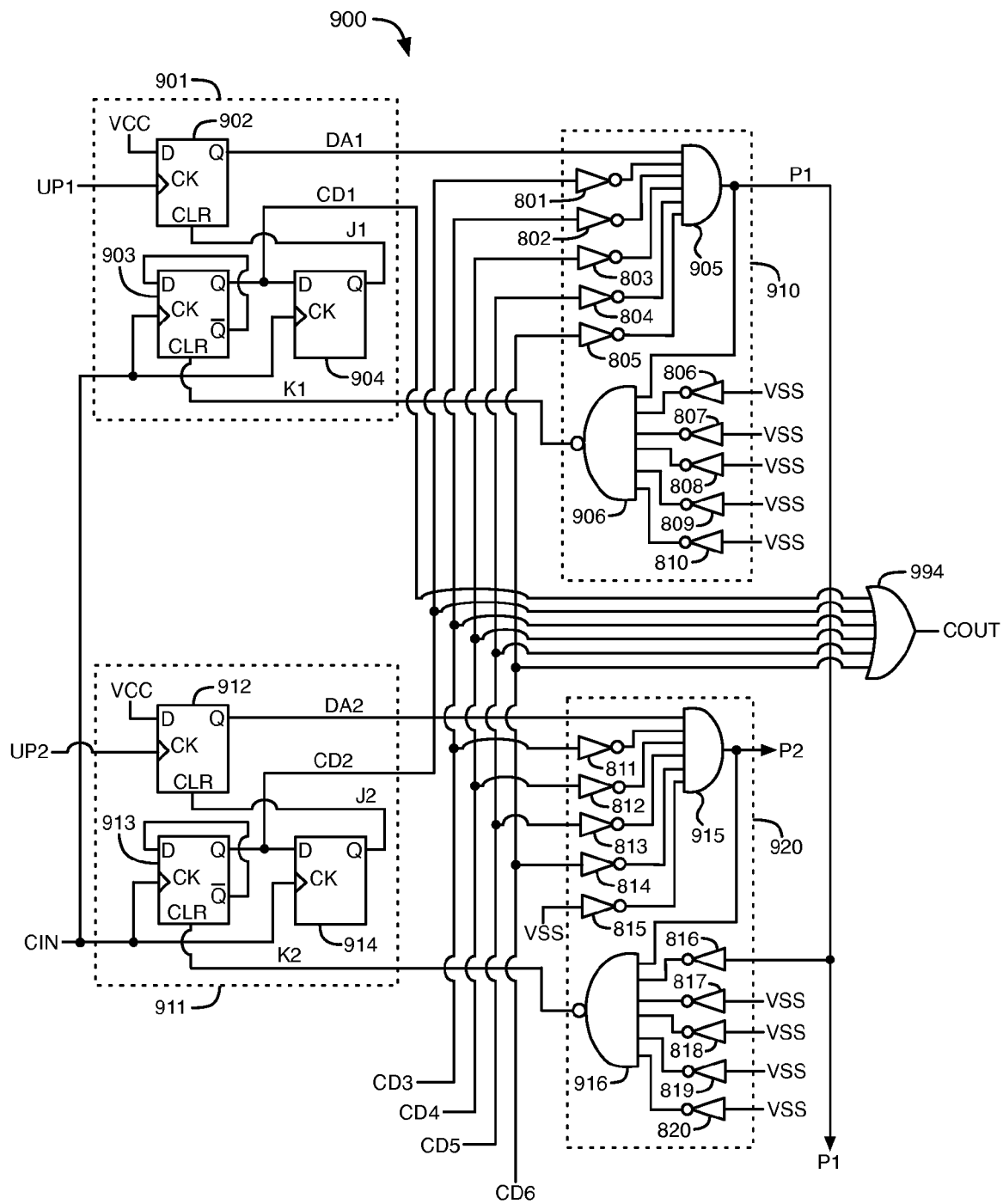
FIGS. 9A-9C illustrate another example of an anti-collision circuit.
Figure 9B:
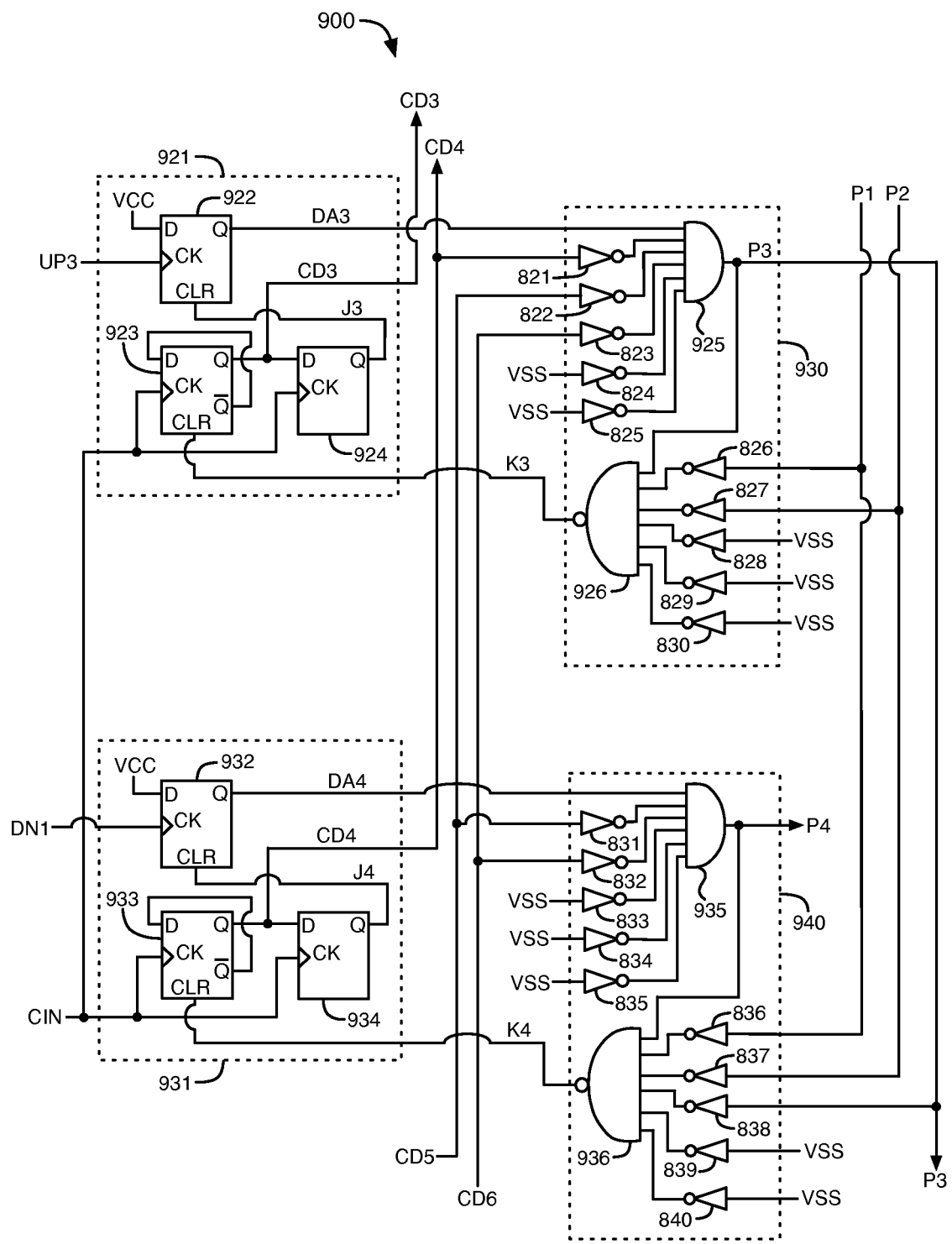
Figure 9C:
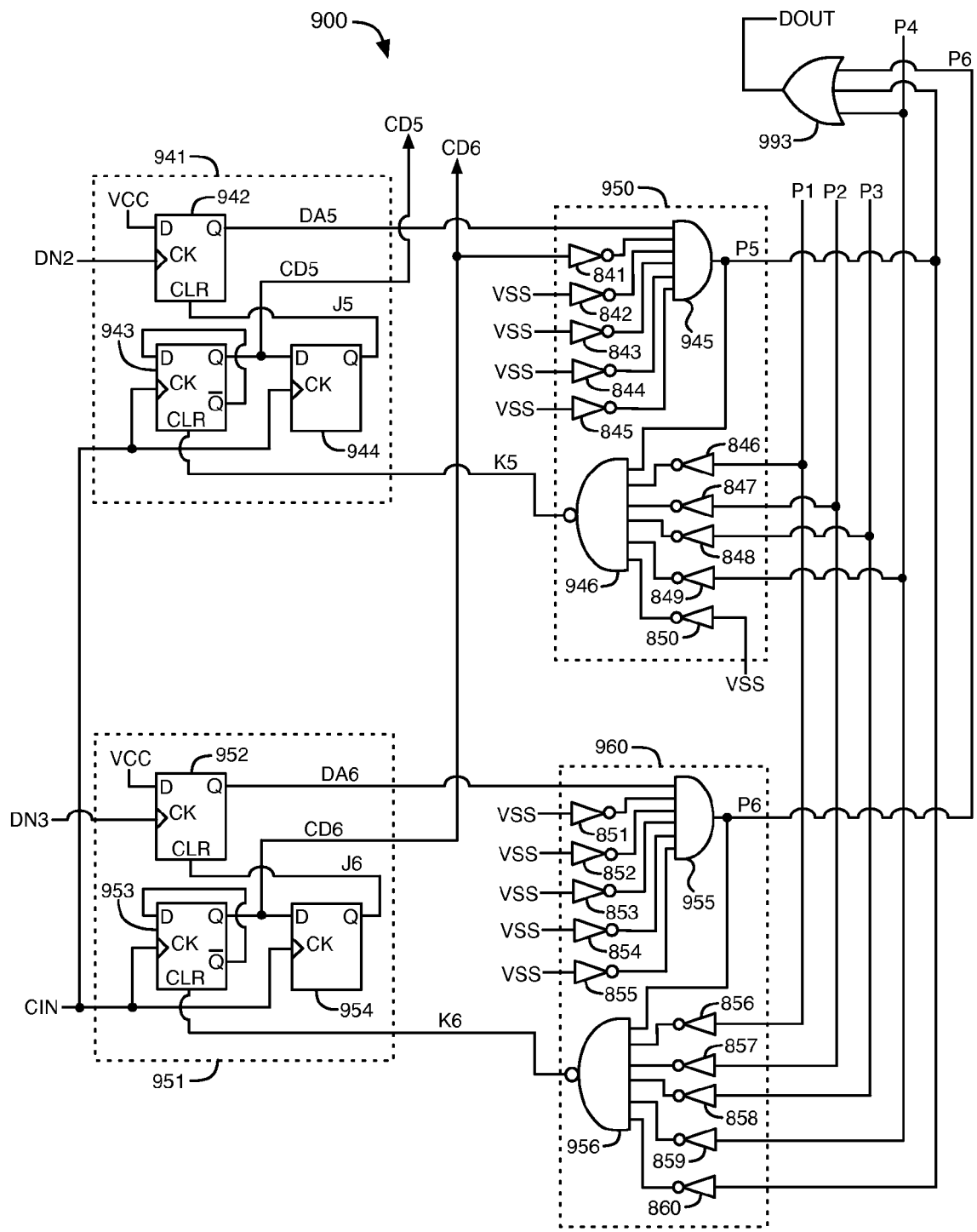

FIGS. 9A-9C illustrate another example of an anti-collision circuit 900. Anti-collision circuit 900 shown in FIGS. 9A-9C includes storage circuits 901, 911, 921, 931, 941, and 951. Anti-collision circuit 900 also includes OR logic gate circuits 993-994 and priority control circuits 910, 920, 930, 940, 950, and 960. Storage circuit 901 includes D flip-flop circuits 902-904. Storage circuit 911 includes D flip-flop circuits 912-914. Storage circuit 921 includes D flip-flop circuits 922-924. Storage circuit 931 includes D flip-flop circuits 932-934. Storage circuit 941 includes D flip-flop circuits 942-944. Storage circuit 951 includes D flip-flop circuits 952-954.

Anti-collision circuit 910 includes AND logic gate circuit 905, NAND logic gate circuit 906, and inverter circuits 801-810. Anti-collision circuit 920 includes AND logic gate circuit 915, NAND logic gate circuit 916, and inverter circuits 811-820. Anti-collision circuit 930 includes AND logic gate circuit 925, NAND logic gate circuit 926, and inverter circuits 821-830. Anti-collision circuit 940 includes AND logic gate circuit 935, NAND logic gate circuit 936, and inverter circuits 831-840. Anti-collision circuit 950 includes AND logic gate circuit 945, NAND logic gate circuit 946, and inverter circuits 841-850. Anti-collision circuit 960 includes AND logic gate circuit 955, NAND logic gate circuit 956, and inverter circuits 851-860.

As shown in FIG. 9A, input signal UP1 is provided to the clock (CK) input of flip-flop circuit 902, and input signal UP2 is provided to the clock (CK) input of flip-flop circuit 912. As shown in FIG. 9B, input signal UP3 is provided to the clock (CK) input of flip-flop circuit 922, and input signal DN1 is provided to the clock (CK) input of flip-flop circuit 932. As shown in FIG. 9C, input signal DN2 is provided to the clock (CK) input of flip-flop circuit 942, and input signal DN3 is provided to the clock (CK) input of flip-flop circuit 952. According to some embodiments, anti-collision circuit 900 is in anti-collision circuit 104 in FIG. 1, digital filter circuit 102 generates signals UP1 and DN1, and SSC circuit 103 generates signals UP2, DN2, UP3, and DN3.

Periodic clock signal CIN is provided to the clock (CK) inputs of flip-flop circuits 903-904, 913-914, 923-924, 933-934, 943-944, and 953-954. A supply voltage VCC that represents a logic high state is provided to the D inputs of flip-flop circuits 902, 912, 922, 932, 942, and 952. Inverter circuits 806-810, 815, 817-820, 824-825, 828-830, 833-835, 839-840, 842-845, and 850-855 generate logic high states in their output signals in response to an input ground voltage VSS that represents a logic low state.

Figure 10A:
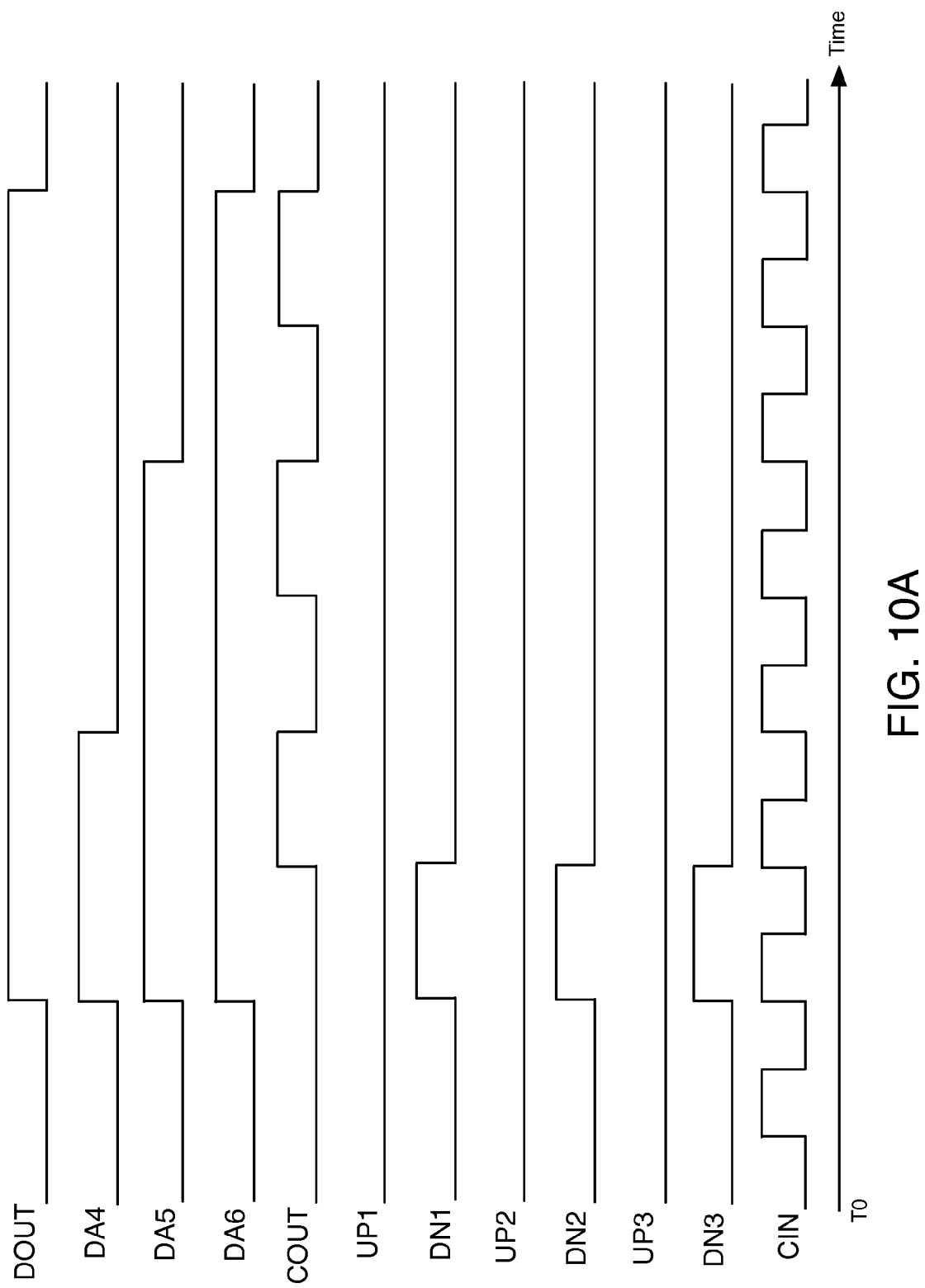
FIGS. 10A-10B are timing diagrams that illustrate exemplary waveforms for signals shown in FIGS. 9A-9C.

FIG. 10A is a timing diagram that illustrates exemplary waveforms for signals DOUT, DA4-DA6, COUT, UP1-UP3, DN1-DN3, and CIN shown in FIGS. 9A-9C when logic high pulses are generated in the DN1-DN3 signals at the same time. In the example of FIG. 10A, signals DOUT, DA1-DA6, COUT, CD1-CD6, UP1-UP3, DN1-DN3, CIN, P1-P6, and J1-J6 are all in logic low states at start time T0.

When signals P1-P6 are in logic low states, NAND logic gates 906, 916, 926, 936, 946, and 956 generate logic high states in the signals K1-K6 at the clear (CLR) inputs of flip-flop circuits 903, 913, 923, 933, 943, and 953, respectively. While signals K1-K6 are in logic high states, flip-flop circuits 903, 913, 923, 933, 943, and 953 maintain the signals CD1, CD2, CD3, CD4, CD5, and CD6, respectively, at their Q outputs in logic low states and the signals at their inverting Q bar outputs in logic high states.

In response to concurrently rising edges in signals DN1, DN2, and DN3 after time T0 as shown in FIG. 10A, flip-flop circuits 932, 942, and 952 generate rising edges in the signals DA4, DA5, and DA6, respectively, stored at their Q outputs. Signals CD5-CD6 are in logic low states after time T0, which cause inverter circuits 831-832 and 841 to generate logic high states in their output signals. AND logic gates 935, 945, and 955 generate rising edges in their output signals P4, P5, and P6 in response to the rising edges in signals DA4, DA5, and DA6, respectively. Signals P4-P6 are provided to inputs of OR logic gate 993, as shown in FIG. 9C. OR logic gate 993 generates a rising edge in its output signal DOUT in response to the rising edges in signals P4-P6, as shown in FIG. 10A.

After time T0, the output signals of inverter circuits 826-827 and 836-838 are in logic high states. In response to the rising edge in signal P4 that occurs after the rising edge in signal DN1, NAND logic gate 936 generates a falling edge in its output signal K4. On the first rising edge in clock signal CIN that occurs after the falling edge in signal K4, flip-flop circuit 933 generates a rising edge in the signal CD4 stored at its Q output and a falling edge in the signal stored at its Q bar output. Signals CD1-CD6 are provided to 6 inputs of OR logic gate 994, as shown in FIG. 9A. OR logic gate 994 generates a first rising edge in its output signal COUT in response to the rising edge in signal CD4, as shown in FIG. 10A.

On the second rising edge in clock signal CIN that occurs after the falling edge in signal K4, flip-flop circuit 933 generates a falling edge in signal CD4, OR logic gate 994 generates a first falling edge in signal COUT as shown in FIG. 10A, and flip-flop circuit 934 generates a rising edge in signal J4. In response to the rising edge in signal J4, flip-flop circuit 932 generates a falling edge in signal DA4, AND logic gate 935 generates a falling edge in signal P4, and NAND logic gate 936 generates a rising edge in signal K4, which causes flip-flop circuit 933 to clear signal CD4 to a logic low state. Signals P5-P6 and DOUT are in logic high states after the falling edge in signal P4.

In response to the falling edge in signal P4, inverter 849 generates a rising edge in its output signal, and NAND logic gate 946 generates a falling edge in signal K5. In response to the first rising edge in clock signal CIN that occurs after the falling edge in signal K5, flip-flop circuit 943 generates a rising edge signal CD5, and then OR logic gate 994 generates a second rising edge in signal COUT, as shown in FIG. 10A. On the second rising edge in clock signal CIN that occurs after the falling edge in signal K5, flip-flop circuit 943 generates a falling edge in signal CD5, OR logic gate 994 generates a second falling edge in signal COUT as shown in FIG. 10A, and flip-flop circuit 944 generates a rising edge in signal J5. In response to the rising edge in signal J5, flip-flop circuit 942 generates a falling edge in signal DA5, AND logic gate 945 generates a falling edge in signal P5, and NAND logic gate 946 generates a rising edge in signal K5, causing flip-flop circuit 943 to clear signal CD5 to a logic low state.

In response to the falling edge in signal P5, inverter 860 generates a rising edge in its output signal, and NAND logic gate 956 generates a falling edge in signal K6. In response to the first rising edge in clock signal CIN that occurs after the falling edge in signal K6, flip-flop circuit 953 generates a rising edge in signal CD6, and then OR logic gate 994 generates a third rising edge in signal COUT, as shown in FIG. 10A. On the second rising edge in clock signal CIN that occurs after the falling edge in signal K6, flip-flop circuit 953 generates a falling edge in signal CD6, OR logic gate 994 generates a third falling edge in signal COUT as shown in FIG. 10A, and flip-flop circuit 954 generates a rising edge in signal J6. In response to the rising edge in signal J6, flip-flop circuit 952 generates a falling edge in signal DA6, and then AND logic gate 955 generates a falling edge in signal P6. In response to the falling edge in signal P6, OR logic gate 993 generates a falling edge in signal DOUT as shown in FIG. 10A, and NAND logic gate 956 generates a rising edge in signal K6, causing flip-flop circuit 953 to clear signal CD6 to a logic low state.

As shown in FIG. 10A, anti-collision circuit 900 generates 3 logic high pulses in output signal COUT that each have a duration of one period of clock signal CIN in response to concurrent rising edges in signals DN1-DN3. Each logic high pulse in signal COUT occurs in a different period of clock signal CIN. Signal DOUT is in a logic high state for the duration of the 3 logic high pulses in signal COUT. Therefore, counter circuit 105 increases the value of the count signals CNT by one in response to each of the 3 rising edges in signal COUT shown in FIG. 10A. PI circuit 106 increases the phase of each of the recovered clock signals to occur later in time by the minimum phase shift of PI circuit 106 in response to each increase of one in the value of count signals CNT. CDR circuit 100 generates a total phase shift in each of the recovered clock signals equal to three times the minimum phase shift in response to concurrent logic high pulses in signals DN1-DN3. The total phase shift is spread out over at least three periods of clock signal CIN to reduce the quantization error.

Figure 10B:
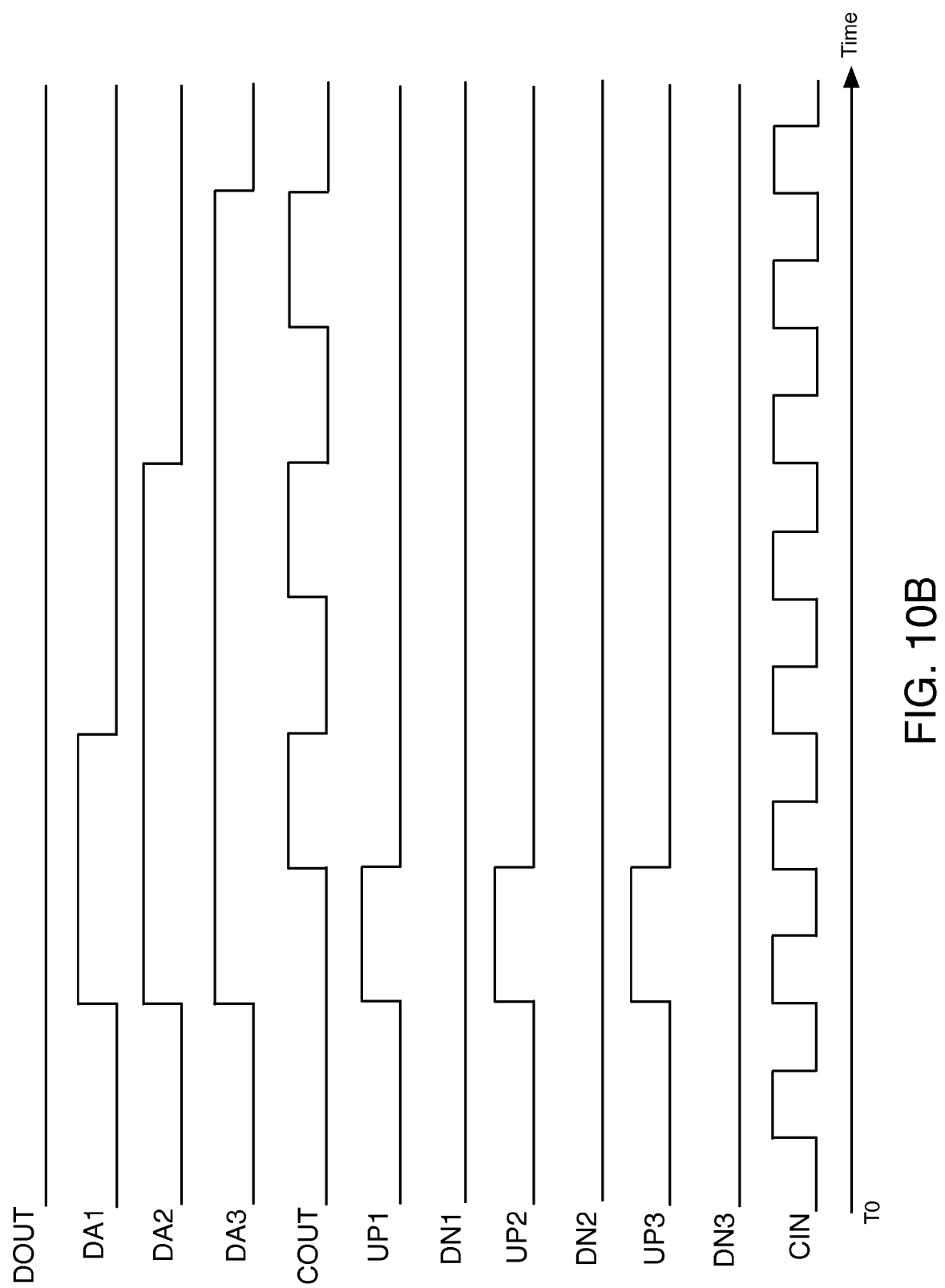

FIG. 10B is a timing diagram that illustrates exemplary waveforms for signals DOUT, DA1-DA3, COUT, UP1-UP3, DN1-DN3, and CIN shown in FIGS. 9A-9C when logic high pulses are generated in the UP1-UP3 signals at the same time. In the example of FIG. 10B, signals DOUT, DA1-DA6, COUT, CD1-CD6, UP1-UP3, DN1-DN3, CIN, P1-P6, and J1-J6 are all in logic low states at start time T0.

In response to concurrently rising edges in signals UP1, UP2, and UP3 after time T0 as shown in FIG. 10B, flip-flop circuits 902, 912, and 922 generate rising edges in the signals DA1, DA2, and DA3, respectively, stored at their Q outputs. After time T0, the output signals of inverter circuits 801-805, 811-815, and 821-825 are in logic high states. AND logic gates 905, 915, and 925 generate rising edges in their output signals P1, P2, and P3 in response to the rising edges in signals DA1, DA2, and DA3, respectively. OR logic gate 993 maintains its output signal DOUT in a logic low state after the rising and falling edges in signals UP1-UP3, as shown in FIG. 10B.

In response to the rising edge in signal P1 following the rising edge in signal UP1, NAND logic gate 906 generates a falling edge in signal K1. On the first rising edge in clock signal CIN that occurs after the falling edge in signal K1, flip-flop circuit 903 generates a rising edge in signal CD1, and then OR logic gate 994 generates a first rising edge in its output signal COUT, as shown in FIG. 10B. On the second rising edge in clock signal CIN that occurs after the falling edge in signal K1, flip-flop circuit 903 generates a falling edge in signal CD1, OR logic gate 994 generates a first falling edge in signal COUT as shown in FIG. 10B, and flip-flop circuit 904 generates a rising edge in signal J1. In response to the rising edge in signal J1, flip-flop circuit 902 generates a falling edge in signal DA1, AND logic gate 905 generates a falling edge in signal P1, and NAND logic gate 906 generates a rising edge in signal K1, which causes flip-flop circuit 903 to clear signal CD1 to a logic low state.

In response to the falling edge in signal P1, NAND logic gate 916 generates a falling edge in signal K2. On the first rising edge in clock signal CIN that occurs after the falling edge in signal K2, flip-flop circuit 913 generates a rising edge in signal CD2, and then OR logic gate 994 generates a second rising edge in signal COUT, as shown in FIG. 10B. On the second rising edge in clock signal CIN that occurs after the falling edge in signal K2, flip-flop circuit 913 generates a falling edge in signal CD2, OR logic gate 994 generates a second falling edge in signal COUT as shown in FIG. 10B, and flip-flop circuit 914 generates a rising edge in signal J2. In response to the rising edge in signal J2, flip-flop circuit 912 generates a falling edge in signal DA2, AND logic gate 915 generates a falling edge in signal P2, and NAND logic gate 916 generates a rising edge in signal K2, causing flip-flop circuit 913 to clear signal CD2 to a logic low state.

In response to the falling edge in signal P2, NAND logic gate 926 generates a falling edge in signal K3. On the first rising edge in clock signal CIN that occurs after the falling edge in signal K3, flip-flop circuit 923 generates a rising edge in signal CD3, and then OR logic gate 994 generates a third rising edge in signal COUT, as shown in FIG. 10B. On the second rising edge in clock signal CIN that occurs after the falling edge in signal K3, flip-flop circuit 923 generates a falling edge in signal CD3, OR logic gate 994 generates a third falling edge in signal COUT as shown in FIG. 10B, and flip-flop circuit 924 generates a rising edge in signal J3. In response to the rising edge in signal J3, flip-flop circuit 922 generates a falling edge in signal DA3, AND logic gate 925 generates a falling edge in signal P3, and NAND logic gate 926 generates a rising edge in signal K3, causing flip-flop circuit 923 to clear signal CD3 to a logic low state.

As shown in FIG. 10B, anti-collision circuit 900 generates 3 logic high pulses in output signal COUT that each have a duration of one period of clock signal CIN in response to concurrent logic high pulses in signals UP1-UP3. Each logic high pulse in signal COUT occurs in a different period of clock signal CIN. Signal DOUT is in a logic low state for the duration of the 3 logic high pulses in signal COUT. Therefore, counter circuit 105 decreases the value of count signals CNT by one in response to each of the 3 rising edges in signal COUT shown in FIG. 10B. PI circuit 106 decreases the phase of each of the recovered clock signals to occur earlier in time by the minimum phase shift of PI circuit 106 in response to each decrease of one in the value of count signals CNT. CDR circuit 100 generates a total phase shift in each of the recovered clock signals equal to three times the minimum phase shift in response to concurrent logic high pulses in signals UP1-UP3. The total phase shift is spread out over at least three periods of clock signal CIN to reduce the quantization error.

Figure 11:
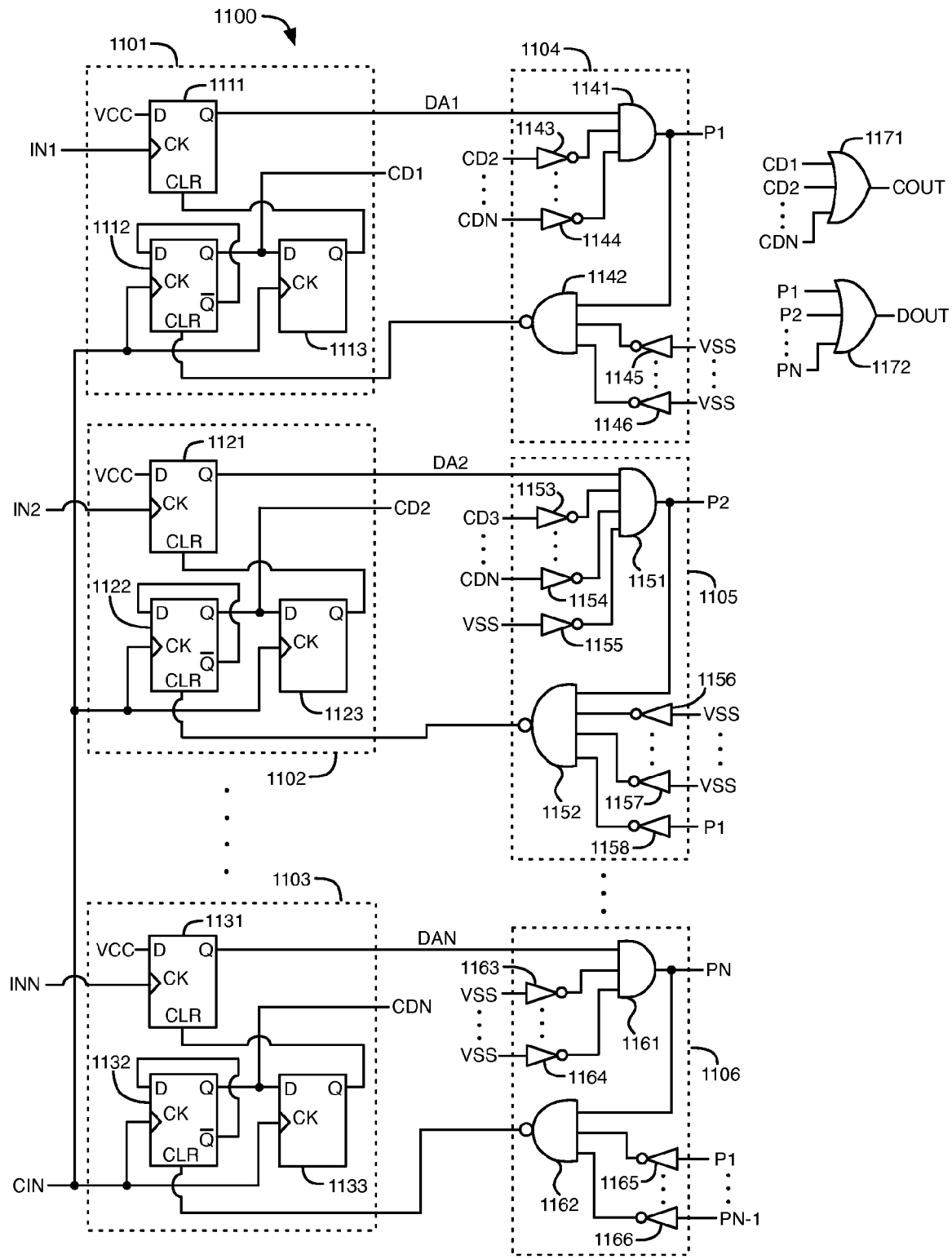
FIG. 11 illustrates another example of an anti-collision circuit.

FIG. 11 illustrates another example of an anti-collision circuit 1100. Anti-collision circuit 1100 shown in FIG. 11 has an N number of 3 or more storage circuits, including storage circuits 1101-1103. Anti-collision circuit 1100 has an N number of 3 or more priority control circuits, including priority control circuits 1104-1106 and OR logic gate circuits 1171-1172.

Storage circuit 1101 includes D flip-flop circuits 1111-1113. Storage circuit 1102 includes D flip-flop circuits 1121-1123. Storage circuit 1103 includes D flip-flop circuits 1131-1133. Priority control circuit 1104 includes AND logic gate circuit 1141, NAND logic gate circuit 1142, and inverter circuits 1143-1146. Priority control circuit 1105 includes AND logic gate circuit 1151, NAND logic gate circuit 1152, and inverter circuits 1153-1158. Priority control circuit 1106 includes AND logic gate circuit 1161, NAND logic gate circuit 1162, and inverter circuits 1163-1166.

Anti-collision circuit 1100 receives an N number of 3 or more input signals IN1, IN2, . . . INN. In an embodiment, a digital filter circuit and an SSC circuit in a clock data recovery feedback loop circuit generate input signals IN1, IN2, . . . INN. In anti-collision circuit 1100, input signal IN1 is provided to the clock (CK) input of flip-flop circuit 1111, input signal IN2 is provided to the clock (CK) input of flip-flop circuit 1121, and input signal INN is provided to the clock (CK) input of flip-flop circuit 1131.

Periodic clock signal CIN is provided to the clock (CK) inputs of flip-flop circuits 1112-1113, 1122-1123, and 1132-1133. A supply voltage VCC that represents a logic high state is provided to the D inputs of flip-flop circuits 1111, 1121, and 1131. A ground voltage VSS that represents a logic low state is provided to the inputs of inverter circuits 1145 . . . 1146, 1155, 1156 . . . 1157, and 1163 . . . 1164. The output signals of inverters 1145 . . . 1146 are provided to inputs of NAND logic gate 1142. The output signals of inverters 1156, . . . 1157, and 1158 are provided to inputs of NAND logic gate 1152. The output signals of inverters 1163 . . . 1164 are provided to inputs of AND logic gate 1161.

The output signals CD1, CD2, . . . CDN of flip-flops 1112, 1122, . . . 1132, respectively, are provided to inputs of OR logic gate 1171. OR logic gate 1171 generates output signal COUT at its output. Output signals P1, P2, . . . PN of priority control circuits 1104, 1105, . . . 1106 are provided to inputs of OR logic gate 1172. OR logic gate 1172 generates output signal DOUT at its output.

The output signals CD2 . . . CDN of flip-flops 1122 . . . 1132 are provided to inputs of inverters 1143 . . . 1144, respectively. The output signals of inverters 1143 . . . 1144 are provided to inputs of AND logic gate 1141. Signals CD3 . . . CDN are provided to inputs of inverters 1153 . . . 1154, respectively. Signal CD3 is an output signal of the third storage circuit in anti-collision circuit 1100. The output signals of inverters 1153 . . . 1154 and 1155 are provided to inputs of AND logic gate 1151. The output signals P1 . . . PN−1 of the first N−1 priority control circuits are provided to inputs of inverters 1165 . . . 1166, respectively. Signal PN−1 is an output signal of the second to last priority control circuit in anti-collision circuit 1100. The output signals of inverters 1165 . . . 1166 are provided to inputs of NAND logic gate 1162.

In response to concurrent logic high pulses in input signals IN1, IN2, . . . INN, anti-collision circuit 1100 generates an N number of logic high pulses in signal COUT that each have a duration of one period of clock signal CIN. Each logic high pulse in signal COUT occurs in a different period of clock signal CIN. Signal DOUT is in a logic high state for the duration of the concurrent N logic high pulses in signal COUT. In an embodiment, signals DOUT and COUT are provided to inputs of a control circuit in a clock data recovery feedback loop circuit. In this embodiment, the control circuit shifts the phases of recovered clock signals generated by the clock data recovery feedback loop circuit in response to each logic high pulse in the COUT signal. The DOUT signal determines the direction of the phase shifts provided to the recovered clock signals.

Figure 12:
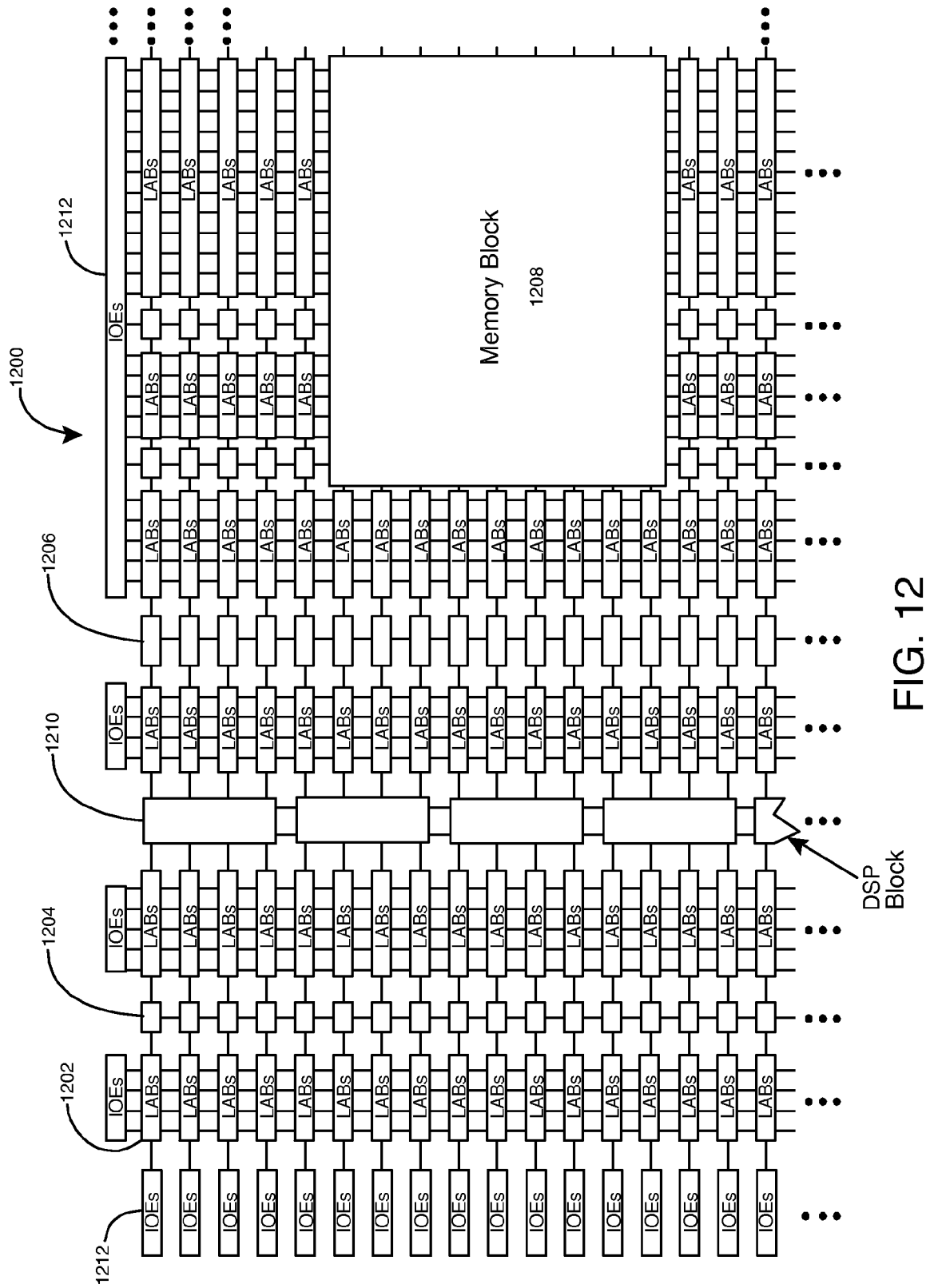
FIG. 12 is a simplified partial block diagram of a field programmable gate array (FPGA) that can include aspects of the present invention.

FIG. 12 is a simplified partial block diagram of a field programmable gate array (FPGA) 1200 that can include aspects of the present invention. FPGA 1200 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 1200 includes a two-dimensional array of programmable logic array blocks (or LABs) 1202 that are interconnected by a network of column and row interconnect conductors of varying length and speed. LABs 1202 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 1200 also includes a distributed memory structure including random access memory (RAM) blocks of varying sizes provided throughout the array. The RAM blocks include, for example, blocks 1204, blocks 1206, and memory block 1208. These memory blocks can also include shift registers and first-in-first-out (FIFO) buffers.

FPGA 1200 further includes digital signal processing (DSP) blocks 1210 that can implement, for example, multipliers with add or subtract features. Input/output elements (IOEs) 1212 support numerous single-ended and differential input/output standards. IOEs 1212 include input and output buffers that are coupled to pins of the integrated circuit. The pins are external terminals of the FPGA die that can be used to route, for example, input signals, output signals, and supply voltages between the FPGA and one or more external devices. FPGA 1200 is described herein for illustrative purposes. Embodiments of the present invention can be implemented in many different types of integrated circuits.

Figure 13:
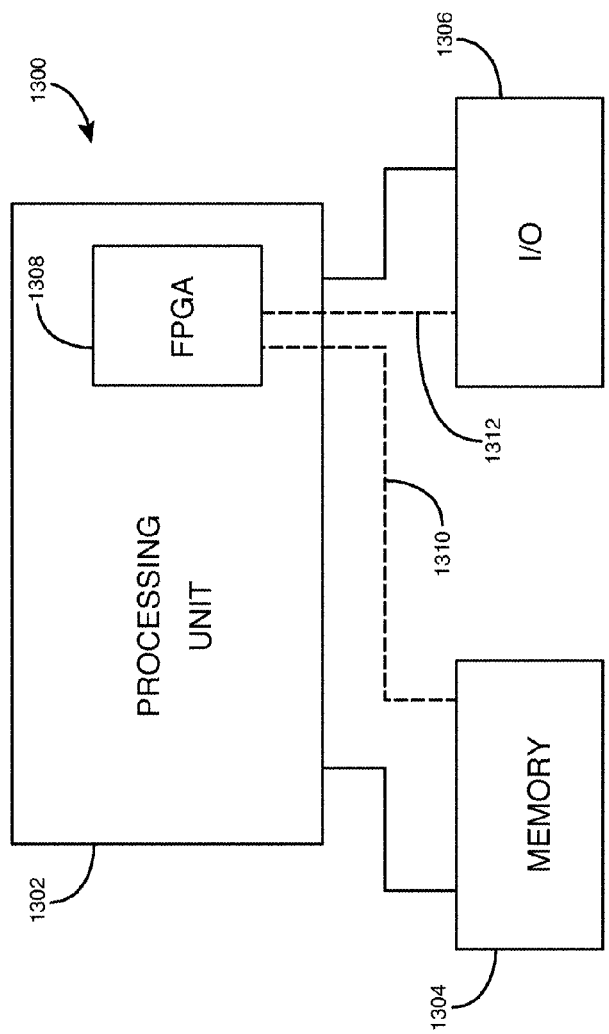
FIG. 13 shows a block diagram of an exemplary digital system that can embody techniques of the present invention.

Embodiments of the present invention can also be implemented in a system that has an FPGA as one of several components. FIG. 13 shows a block diagram of an exemplary digital system 1300 that can embody techniques of the present invention. System 1300 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. System 1300 can be provided on a single board, on multiple boards, or within multiple enclosures.

System 1300 includes a processing unit 1302, a memory unit 1304, and an input/output (I/O) unit 1306 interconnected together by one or more buses. According to this exemplary embodiment, an FPGA 1308 is embedded in processing unit 1302. FPGA 1308 can serve many different purposes within the system of FIG. 13. FPGA 1308 can, for example, be a logical building block of processing unit 1302, supporting its internal and external operations. FPGA 1308 is programmed to implement the logical functions necessary to carry on its particular role in system operation. FPGA 1308 can be specially coupled to memory 1304 through connection 1310 and to I/O unit 1306 through connection 1312.

Processing unit 1302 can direct data to an appropriate system component for processing or storage, execute a program stored in memory 1304, receive and transmit data via I/O unit 1306, or other similar functions. Processing unit 1302 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1308 can control the logical operations of the system. As another example, FPGA 1308 acts as a reconfigurable processor that can be reprogrammed as needed to handle a particular computing task. Alternatively, FPGA 1308 can itself include an embedded microprocessor. Memory unit 1304 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   a first storage circuit that generates a first stored signal in response to a first input signal;
   a first priority control circuit that generates a first priority signal based on the first stored signal, wherein the first storage circuit adjusts a first output signal based on the first priority signal indicating a change in the first stored signal caused by the first input signal,
   a second storage circuit that generates a second stored signal in response to a second input signal; and
   a second priority control circuit that generates a second priority signal based on the first and the second stored signals, wherein the second storage circuit adjusts a second output signal based on the second priority signal indicating a change in the first stored signal caused by the first priority signal.

2. The circuit of claim 1, wherein the circuit is a feedback loop circuit, wherein the feedback loop circuit controls a phase of a clock signal based on the first and the second output signals, and wherein the feedback loop circuit generates the first and the second input signals based on a phase comparison between the clock signal and a data signal.

3. The circuit of claim 2 further comprising:
   a first logic gate circuit that generates a third output signal based on the first and the second output signals;
   a second logic gate circuit that generates a fourth output signal based on the first and the second stored signals; and
   a phase shift circuit that triggers a phase shift in the clock signal based on the third output signal and that determines a direction of the phase shift based on the fourth output signal.

4. The circuit of claim 1, wherein the first priority control circuit causes the first storage circuit to generate a pulse in the first output signal after the first stored signal indicates a first value, wherein the first storage circuit stores a second value in the first stored signal in response to the pulse in the first output signal,
   wherein the second priority control circuit causes the second storage circuit to generate a pulse in the second output signal after the second stored signal indicates the first value and the first stored signal indicates the second value, and wherein the second storage circuit stores the second value in the second stored signal in response to the pulse in the second output signal.

5. The circuit of claim 1 further comprising:
   a third storage circuit that generates a third stored signal in response to a third input signal;
   a third priority control circuit that generates a third priority signal based on the first, the second, and the third stored signals, wherein the third storage circuit adjusts a third output signal based on the third priority signal indicating a change in the second stored signal caused by the second priority signal;
   a fourth storage circuit that generates a fourth stored signal in response to a fourth input signal;
   a fourth priority control circuit that generates a fourth priority signal based on the first, the second, the third, and the fourth stored signals, wherein the fourth storage circuit adjusts a fourth output signal based on the fourth priority signal indicating a change in the third stored signal caused by the third priority signal; and
   a logic gate circuit that generates a fifth output signal based on the first, the second, the third, and the fourth output signals.

6. The circuit of claim 1, wherein the first storage circuit comprises a first flip-flop circuit that generates the first stored signal and a second flip-flop circuit that generates the first output signal, and wherein the second storage circuit comprises a third flip-flop circuit that generates the second stored signal and a fourth flip-flop circuit that generates the second output signal.

7. The circuit of claim 6, wherein the first priority control circuit comprises first and second logic gate circuits, wherein the first logic gate circuit generates a third priority signal based on the first stored signal and the second output signal, wherein the second logic gate circuit generates the first priority signal based on the third priority signal,
   wherein the second priority control circuit comprises third and fourth logic gate circuits, wherein the third logic gate circuit generates a fourth priority signal based on the second stored signal, and wherein the fourth logic gate circuit generates the second priority signal based on the third and the fourth priority signals.

8. The circuit of claim 7 further comprising:
   a third storage circuit comprising a fifth flip-flop circuit that generates a third stored signal and a sixth flip-flop circuit that generates a third output signal; and
   a third priority control circuit comprising fifth and sixth logic gate circuits, wherein the fifth logic gate circuit generates a fifth priority signal based on the third stored signal, wherein the sixth logic gate circuit generates a sixth priority signal based on the third, the fourth, and the fifth priority signals, and wherein the third storage circuit adjusts the third output signal based on the sixth priority signal indicating a change in the second stored signal caused by the second priority signal.

9. The circuit of claim 8 further comprising:
a fourth storage circuit comprising a seventh flip-flop circuit that generates a fourth stored signal and an eighth flip-flop circuit that generates a fourth output signal; and
a fourth priority control circuit comprising seventh and eighth logic gate circuits, wherein the seventh logic gate circuit generates a seventh priority signal based on the fourth stored signal, wherein the eighth logic gate circuit generates a eighth priority signal based on the third, the fourth, the fifth, and the seventh priority signals, and wherein the fourth storage circuit adjusts the fourth output signal based on the eighth priority signal indicating a change in the third stored signal caused by the sixth priority signal.

10. A method comprising:
storing a first stored signal in a first storage circuit in response to a first input signal;
generating a first priority signal based on the first stored signal;
adjusting a first output signal that is stored in the first storage circuit based on the first priority signal indicating a change in the first stored signal caused by the first input signal;
storing a second stored signal in a second storage circuit in response to a second input signal;
generating a second priority signal based on the first and the second stored signals; and
adjusting a second output signal that is stored in the second storage circuit based on the second priority signal indicating a change in the first stored signal caused by the first priority signal.

11. The method of claim 10 further comprising:
controlling a phase of a periodic signal based on the first and the second output signals using a phase shift circuit; and
generating the first and the second input signals based on a phase comparison between the periodic signal and a data signal using a sampler circuit and a filter circuit.

12. The method of claim 11 further comprising:
generating a third output signal based on the first and the second output signals; and
generating a fourth output signal based on the first and the second stored signals,
wherein controlling a phase of a periodic signal based on the first and the second output signals using a phase shift circuit further comprises triggering a phase shift in the periodic signal based on the third output signal, and determining a direction of the phase shift based on the fourth output signal using the phase shift circuit.

13. The method of claim 10 further comprising:
adjusting the first stored signal in response to a transition in the first output signal, wherein the transition in the first output signal is generated after a change in the first priority signal; and
adjusting the second stored signal in response to a transition in the second output signal, wherein the transition in the second output signal is generated after a change in the second priority signal.

14. The method of claim 10 further comprising:
storing a third stored signal in a third storage circuit in response to a third input signal;
generating a third priority signal based on the first, the second, and the third stored signals;
adjusting a third output signal that is stored in the third storage circuit based on the third priority signal indicating a change in the second stored signal caused by the second priority signal;

storing a fourth stored signal in a fourth storage circuit in response to a fourth input signal;
generating a fourth priority signal based on the first, the second, the third, and the fourth stored signals; and
adjusting a fourth output signal that is stored in the fourth storage circuit based on the fourth priority signal indicating a change in the third stored signal caused by the third priority signal.

15. The method of claim 10, wherein storing a first stored signal in a first storage circuit in response to a first input signal further comprises generating the first stored signal using a first flip-flop circuit,
wherein adjusting a first output signal that is stored in the first storage circuit based on the first priority signal indicating a change in the first stored signal caused by the first input signal further comprises generating the first output signal using a second flip-flop circuit,
wherein storing a second stored signal in a second storage circuit in response to a second input signal further comprises generating the second stored signal using a third flip-flop circuit, and
wherein adjusting a second output signal that is stored in the second storage circuit based on the second priority signal indicating a change in the first stored signal caused by the first priority signal further comprises generating the second output signal using a fourth flip-flop circuit.

16. The method of claim 10, wherein generating a first priority signal based on the first stored signal further comprises generating a third priority signal based on the first stored signal and the second output signal using a first logic gate circuit, and generating the first priority signal based on the third priority signal using a second logic gate circuit, and
wherein generating a second priority signal based on the first and the second stored signals further comprises generating a fourth priority signal based on the second stored signal using a third logic gate circuit, and generating the second priority signal based on the third and the fourth priority signals using a fourth logic gate circuit.

17. An anti-collision circuit comprising:
a first storage circuit to generate a first stored signal based on a first input signal;
a first priority control circuit to generate a first priority signal based on the first stored signal, wherein the anti-collision circuit generates a first pulse in a first output signal based on the first priority signal,
a second storage circuit to generate a second stored signal based on a second input signal; and
a second priority control circuit to generate a second priority signal based on the first and the second stored signals, wherein the anti-collision circuit generates a second pulse in the first output signal based on the second priority signal, and wherein the anti-collision circuit generates the first and the second pulses in the first output signal based on concurrent pulses in the first and the second input signals.

18. The anti-collision circuit of claim 17, wherein the anti-collision circuit is coupled to a feedback loop circuit, wherein the feedback loop circuit controls a phase of a clock signal based on the first output signal, and wherein the feedback loop circuit generates the first and the second input signals based on a phase comparison between the clock signal and a data signal.

19. The anti-collision circuit of claim 18, wherein the feedback loop circuit comprises a phase shift circuit that triggers a phase shift in the clock signal based on the first output signal and that determines a direction of the phase shift based on a second output signal of the anti-collision circuit.

20. The anti-collision circuit of claim 17 further comprising:
- a third storage circuit to generate a third stored signal based on a third input signal; and
- a third priority control circuit to generate a third priority signal based on the first, the second, and the third stored signals, wherein the anti-collision circuit generates a third pulse in the first output signal based on the third priority signal, and wherein the anti-collision circuit generates the first, the second, and the third pulses in the first output signal based on concurrent pulses in the first, the second, and the third input signals.

* * * * *